United States Patent
Eshleman et al.

(10) Patent No.: US 12,358,397 B2
(45) Date of Patent: *Jul. 15, 2025

(54) BATTERY MONITORING SYSTEM FOR A LIFT DEVICE

(71) Applicant: Oshkosh Corporation, Oshkosh, WI (US)

(72) Inventors: Stefan Eshleman, Oshkosh, WI (US); Michael Bolton, Oshkosh, WI (US); Patrick Booth, Oshkosh, WI (US)

(73) Assignee: Oshkosh Corporation, Oshkosh, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/736,139

(22) Filed: Jun. 6, 2024

(65) Prior Publication Data

US 2024/0317107 A1 Sep. 26, 2024

Related U.S. Application Data

(63) Continuation of application No. 17/193,358, filed on Mar. 5, 2021, now Pat. No. 12,036,888.
(Continued)

(51) Int. Cl.
*B60L 58/12* (2019.01)
*B60L 58/18* (2019.01)
(Continued)

(52) U.S. Cl.
CPC ............... *B60L 58/12* (2019.02); *B60L 58/18* (2019.02); *B66F 13/00* (2013.01);
(Continued)

(58) Field of Classification Search
CPC ...... B60L 58/12; B60L 58/18; B60L 2200/40; B66F 13/00; B66F 11/044;
(Continued)

(56) References Cited

U.S. PATENT DOCUMENTS 6,266,598 B1 7/2001 Pillar et al.
6,421,593 B1 7/2002 Kempen et al.
(Continued)

FOREIGN PATENT DOCUMENTS

| EP | 0 921 094 A2 | 6/1999 |
|---|---|---|
| EP | 2 712 046 A1 | 3/2014 |
| EP | 3 112 312 A1 | 1/2017 |

*Primary Examiner* — Peter D Nolan
*Assistant Examiner* — Demetra R Smith-Stewart
(74) *Attorney, Agent, or Firm* — Foley & Lardner LLP

(57) ABSTRACT

A lift device includes multiple electrical components and a battery monitoring system. The battery monitoring system includes multiple batteries and a controller. The multiple batteries are configured to power the multiple electrical components. The controller is configured to obtain sensor data from the batteries. The controller is also configured to determine a state of charge of the batteries for open circuit conditions based on the sensor data. The controller is configured to determine a state of charge of the batteries for load conditions based on the sensor data. The controller is configured to determine a state of charge of the batteries for charging conditions based on the sensor data. The controller determines an overall state of charge of the batteries based on the state of charge for open circuit conditions, the state of charge of the batteries for load conditions, and the state of charge for charging conditions.

20 Claims, 31 Drawing Sheets

Related U.S. Application Data

(60) Provisional application No. 62/986,015, filed on Mar. 6, 2020.

(51) Int. Cl.
   | | | |
   |---|---|---|
   | *B66F 11/04* | (2006.01) | |
   | *B66F 13/00* | (2006.01) | |
   | *G01R 31/3842* | (2019.01) | |
   | *G01R 31/392* | (2019.01) | |
   | *H01M 10/42* | (2006.01) | |
   | *H01M 10/48* | (2006.01) | |
   | *H04Q 9/00* | (2006.01) | |

(52) U.S. Cl.
   CPC ....... *G01R 31/3842* (2019.01); *G01R 31/392* (2019.01); *H01M 10/4257* (2013.01); *H01M 10/482* (2013.01); *H01M 10/484* (2013.01); *H01M 10/486* (2013.01); *H01M 10/488* (2013.01); *H04Q 9/00* (2013.01); *B60L 2200/40* (2013.01); *B66F 11/044* (2013.01); *H01M 2010/4278* (2013.01)

(58) Field of Classification Search
   CPC ............. G01R 31/3842; G01R 31/392; H01M 10/4257; H01M 10/482; H01M 10/484; H01M 10/486; H01M 10/488; H01M 2010/4278; H04Q 9/00; Y02E 60/10; Y02T 10/70; H02J 7/0047; H02J 7/005; H02J 7/0048
   See application file for complete search history.

(56) References Cited

U.S. PATENT DOCUMENTS

| | | | |
|---|---|---|---|
| 6,553,290 B1 | 4/2003 | Pillar | |
| 6,757,597 B2 | 6/2004 | Yakes et al. | |
| 6,885,920 B2 | 4/2005 | Yakes et al. | |
| 6,909,944 B2 | 6/2005 | Pillar et al. | |
| 6,922,615 B2 | 7/2005 | Pillar et al. | |
| 6,993,421 B2 | 1/2006 | Pillar et al. | |
| 7,006,902 B2 | 2/2006 | Archer et al. | |
| 7,024,296 B2 | 4/2006 | Squires et al. | |
| 7,072,745 B2 | 7/2006 | Pillar et al. | |
| 7,107,129 B2 | 9/2006 | Rowe et al. | |
| 7,127,331 B2 | 10/2006 | Pillar et al. | |
| 7,162,332 B2 | 1/2007 | Pillar et al. | |
| 7,164,977 B2 | 1/2007 | Yakes et al. | |
| 7,184,862 B2 | 2/2007 | Pillar et al. | |
| 7,184,866 B2 | 2/2007 | Squires et al. | |
| 7,254,468 B2 | 8/2007 | Pillar et al. | |
| 7,274,976 B2 | 9/2007 | Rowe et al. | |
| 7,274,979 B2 | 9/2007 | Fujioka | |
| 7,277,782 B2 | 10/2007 | Yakes et al. | |
| 7,302,320 B2 | 11/2007 | Nasr et al. | |
| 7,392,122 B2 | 6/2008 | Pillar et al. | |
| 7,439,711 B2 | 10/2008 | Bolton | |
| 7,522,979 B2 | 4/2009 | Pillar | |
| 7,555,369 B2 | 6/2009 | Pillar et al. | |
| 7,689,332 B2 | 3/2010 | Yakes et al. | |
| 7,711,460 B2 | 5/2010 | Yakes et al. | |
| 7,715,962 B2 | 5/2010 | Rowe et al. | |
| 7,756,621 B2 | 7/2010 | Pillar et al. | |
| 7,831,363 B2 | 11/2010 | Quigley | |
| 8,095,247 B2 | 1/2012 | Pillar et al. | |
| 9,062,983 B2 | 6/2015 | Zych | |
| 10,414,385 B2 | 9/2019 | Linsmeier et al. | |
| 10,901,409 B2 | 1/2021 | Datema et al. | |
| 2010/0019773 A1 | 1/2010 | Son | |
| 2015/0112527 A1* | 4/2015 | Zhang | G01R 31/382 701/22 |
| 2017/0123013 A1 | 5/2017 | Tao et al. | |
| 2018/0123355 A1* | 5/2018 | Olson | H02J 7/00718 |
| 2019/0033385 A1 | 1/2019 | Karner et al. | |
| 2019/0033395 A1 | 1/2019 | Karner et al. | |
| 2019/0294173 A1* | 9/2019 | Szubbocsev | G05D 1/0274 |
| 2019/0359184 A1 | 11/2019 | Linsmeier et al. | |
| 2019/0383880 A1 | 12/2019 | Naskali | |
| 2019/0389705 A1 | 12/2019 | Radtke et al. | |
| 2021/0113130 A1* | 4/2021 | Tran | A61B 5/14532 |
| 2021/0124347 A1 | 4/2021 | Datema et al. | |

* cited by examiner

BATTERY MONITORING SYSTEM FOR A LIFT DEVICE

CROSS-REFERENCE TO RELATED PATENT APPLICATION

This application is a continuation of U.S. application Ser. No. 17/193,358, filed Mar. 5, 2021, which claims the benefit of and priority to U.S. Provisional Application No. 62/986,015, filed Mar. 6, 2020, the entire disclosure of which is incorporated by reference herein.

BACKGROUND

The present disclosure relates to lifting devices. More particularly, the present disclosure relates to a battery monitoring system for a lifting device.

SUMMARY

One embodiment of the present disclosure relates to a lift device. The lift device includes multiple electrical components and a battery monitoring system. The battery monitoring system includes multiple batteries and a controller. The multiple batteries are configured to power the multiple electrical components. The controller is configured to obtain sensor data from the batteries. The controller is also configured to determine a state of charge of the batteries for open circuit conditions based on the sensor data. The controller is configured to determine a state of charge of the batteries for load conditions based on the sensor data. The controller is configured to determine a state of charge of the batteries for charging conditions based on the sensor data. The controller is configured to determine an overall state of charge of the batteries based on the state of charge for open circuit conditions, the state of charge of the batteries for load conditions, and the state of charge for charging conditions.

Another embodiment of the present disclosure relates to a battery monitoring system for a device. The battery monitoring system includes multiple batteries configured to power electrical components of the device. The controller is configured to obtain sensor data from the batteries, determine a state of charge of the batteries for open circuit conditions based on the sensor data, determine a state of charge of the batteries for load conditions based on the sensor data, and determine a state of charge of the batteries for charging conditions based on the sensor data. The controller is also configured to determine an overall state of charge of the batteries based on the state of charge for open circuit conditions, the state of charge of the batteries for load conditions, and the state of charge for charging conditions.

Another embodiment of the present disclosure relates to a method for monitoring batteries of a lift device. The method includes obtaining sensor data from multiple batteries of the lift device, determining an overall state of charge of the batteries based on a state of charge of the plurality of batteries for open circuit conditions, a state of charge of the plurality of batteries for load conditions based, and a state of charge of the plurality of batteries for charging conditions. The method includes providing the overall state of charge of the plurality of batteries to a user device.

The invention is capable of other embodiments and of being carried out in various ways. Alternative exemplary embodiments relate to other features and combinations of features as may be recited herein.

BRIEF DESCRIPTION OF THE DRAWINGS

The disclosure will become more fully understood from the following detailed description, taken in conjunction with the accompanying figures, wherein like reference numerals refer to like elements, in which.

DETAILED DESCRIPTION

Figure 1:
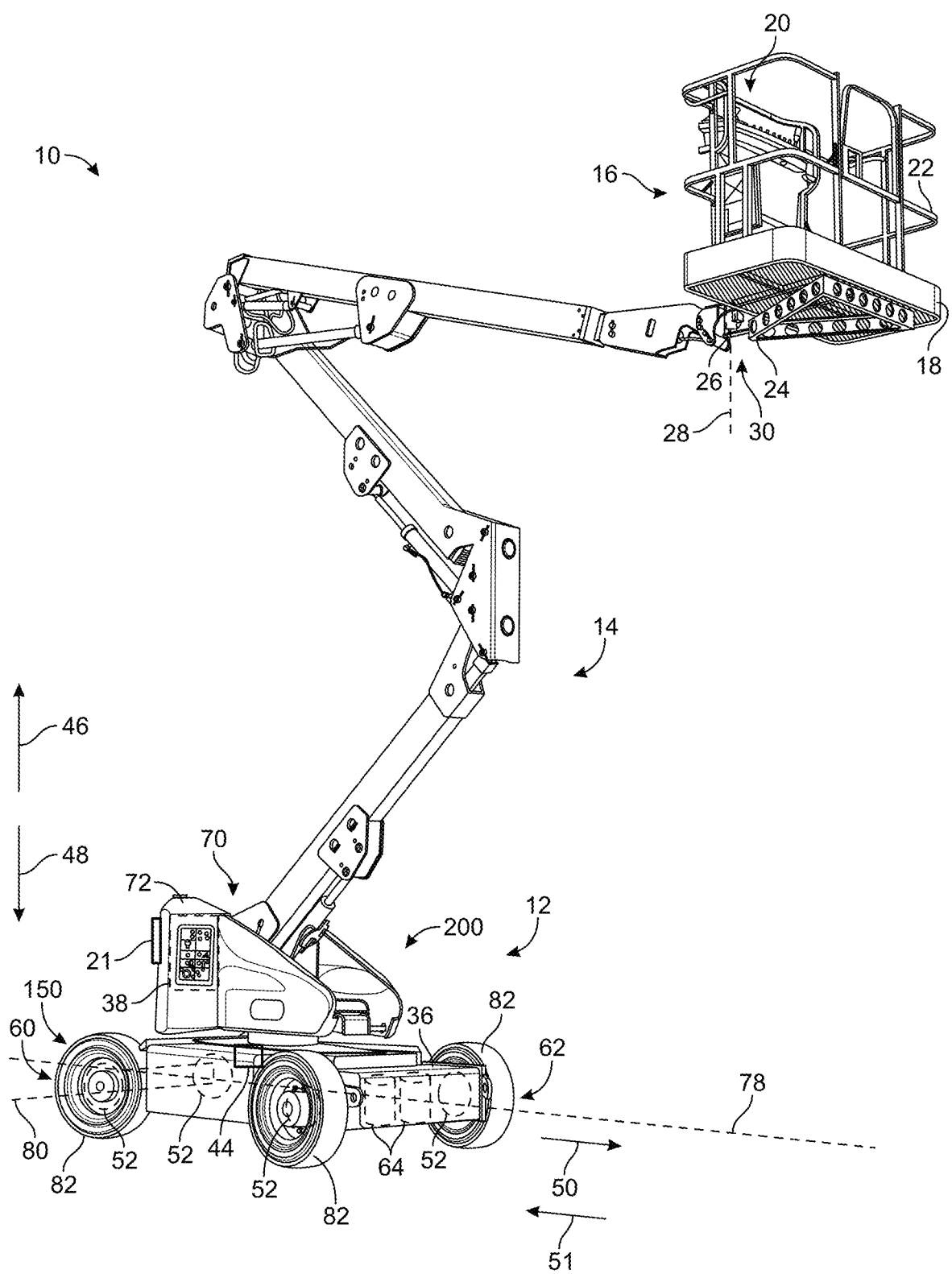
FIG. 1 is a perspective view of a lift device, according to an exemplary embodiment.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Overview

Referring generally to the FIGURES, systems and methods for battery monitoring of a lift device are shown. The lift device may be a boom, a telehandler, a fully electric lift device, a scissors lift, etc. The systems and methods described herein analyze a battery charge and usage of the lift device and provide enhanced diagnostic information for the battery and a charger system. Components include a charger, which logs charge history and details on a machine controller, and a controller that provides wireless connectivity and interaction.

The systems and methods described herein provide detailed information regarding charge history that is not provided by other battery monitoring systems. This facilitates allowing users to make more accurate service decisions. The controller may couple with a mobile application for battery monitoring, will may lead to lower total cost of ownership.

When the controller is used with the mobile application, the systems and methods described herein provide real-time information, including accurate state-of-charge, battery depletion tracking, fluid level monitoring and charging history. This information may be available in an intuitive mobile application that empowers users to make informed decisions about an energy or battery system of the lift device.

The systems and methods described herein can facilitate increased or improved uptime or operational time of the lift device. Lift devices that rapidly lose charge during the workday may slow productivity. Owners and operators can analyze depletion tracking and current status at the fleet level (e.g., through the mobile application) to gain a better understanding of the batteries and charger in seconds, without the time-consuming process of visiting each lift device.

The systems and methods described herein can also facilitate reduced maintenance and replacement costs. For example, the mobile application may include actionable data or recommendations regarding user action that encourages machine owners and operators to follow recommended charge/discharge practices. Following recommended charge/discharge practices can lead to a 40% improvement in battery life. Additionally, the systems and methods described herein may help reduce up to 70% of charger replacements that are performed in error due to a lack of actionable or detailed data.

The systems and methods described herein can also facilitate time savings. Specifically, the systems and methods described herein automate and simplify time-consuming charger algorithm, so maintenance times are decreased (e.g., maintenance times may be up to eight times faster). Additionally, the systems and methods described herein can facilitate reducing an amount of time that service technicians spend changing batteries and/or chargers. Instead, the service technicians may monitor the batteries and/or chargers (e.g., via the mobile application) and make informed decisions about battery maintenance.

The systems and methods can also allow machine operators to access battery data in several convenient formats based on their needs. Machine operators can use the charger (e.g., a smart charger) on its own and access data with a handheld analyzer or pair the charger with mobile control hardware. Users can also access data from the mobile application.

The mobile application gives operators access to battery information when they are within a certain distance (e.g., 30 feet) of the machine or group of machines that either are actively in use or plugged in for charging. This facilitates a one-to-many connection locally that drastically improves effectiveness and operator convenience of data.

The charger may be a preexisting or standard charger that is already installed on the lift device. Mobile control hardware can be optional for different types of lift devices. Customers who already own a lift device can retrofit their machines by purchasing the system's components separately or together.

Lifting Device

Referring to FIG. 1, a lifting apparatus, a telehandler, a scissors lift, a boom lift, a towable boom lift, a lift device, a fully electric lift device, etc., shown as lift device 10 includes a base assembly 12 (e.g., a support assembly, a drivable support assembly, a support structure, etc.), a platform assembly 16 (e.g., a platform, a terrace, etc.), and a lift assembly 14 (e.g., a boom lift assembly, a lifting apparatus, an articulated arm, a scissors lift, etc.). If lift device 10 is a telehandler, platform assembly 16 can be replaced with a fork apparatus, a bucket apparatus, a material lifting apparatus, a mechanical lifting apparatus attachment, etc. Lift device 10 includes a front end (e.g., a forward facing end, a front portion, a front, etc.), shown as front 62, and a rear end (e.g., a rearward facing end, a back portion, a back, a rear, etc.,) shown as rear 60. Lift assembly 14 is configured to elevate platform assembly 16 in an upwards direction 46 relative to base assembly 12. Lift assembly 14 is also configured to translate platform assembly 16 in a downwards direction 48. Lift assembly 14 is also configured to translate platform assembly 16 in either a forwards direction 50 or a rearwards direction 51. Lift assembly 14 generally facilitates performing a lifting function to raise and lower platform assembly 16, as well as movement of platform assembly 16 in various directions to access elevated locations.

Base assembly 12 defines a longitudinal axis 78 and a lateral axis 80. Longitudinal axis 78 defines forwards direction 50 of lift device 10 and rearwards direction 51. Lift device 10 is configured to translate in forwards direction 50 and to translate backwards in rearwards direction 51. Base assembly 12 includes one or more wheels, tires, wheel assemblies, tractive elements, rotary elements, treads, etc., shown as tractive elements 82. Tractive elements 82 are configured to rotate to drive (e.g., translate, steer, move, etc.) lift device 10. Tractive elements 82 can cach include an electric motor 52 (e.g., electric wheel motors) configured to drive tractive elements 82 (e.g., to rotate tractive elements 82 to facilitation motion of lift device 10). In other embodiments, tractive elements 82 are configured to receive power (e.g., rotational mechanical energy) from electric motors 52 through a drive train (e.g., a combination of any number and configuration of a shaft, an axle, a gear reduction, a gear train, etc.). Tractive elements 82 and electric motors 52 can facilitate a driving and/or steering function of lift device 10.

Platform assembly 16 is configured to provide a work area for an operator of lift device 10 to stand/rest upon. Platform assembly 16 can be pivotally coupled to an upper end of lift assembly 14. Lift device 10 is configured to facilitate the operator accessing various elevated areas (e.g., lights, platforms, the sides of buildings, building scaffolding, trees, power lines, etc.). Lift device 10 uses various electrically powered motors and electrically powered linear actuators to facilitate elevation of platform assembly 16 (e.g., relative to base assembly 12, or to a ground surface that base assembly 12 rests upon).

Platform assembly 16 includes a base member, a base portion, a platform, a standing surface, a shelf, a work platform, a floor, a deck, etc., shown as deck 18. Deck 18 provides a space (e.g., a floor surface) for a worker to stand upon as platform assembly 16 is raised and lowered.

Platform assembly 16 includes various members, beams, bars, guard rails, rails, railings, etc., shown as rails 22. Rails 22 extend along substantially an entire perimeter of deck 18. Rails 22 provide one or more members for the operator of lift device 10 to grasp while using lift device 10 (e.g., to grasp while operating lift device 10 to elevate platform assembly 16). Rails 22 can include members that are substantially horizontal to deck 18. Rails 22 can also include vertical structural members that couple with the substantially horizontal members. The vertical structural members can extend upwards from deck 18.

Platform assembly 16 can include a human machine interface (HMI) (e.g., a user interface), shown as HMI 20. HMI 20 is configured to receive user inputs from the operator at platform assembly 16 to facilitate operation of lift device 10. HMI 20 can include any number of buttons, levers, switches, keys, etc., or any other user input device configured to receive a user input to operate lift device 10. HMI 20 can be supported by one or more of rails 22.

Platform assembly 16 includes a frame 24 (e.g., structural members, support beams, a body, a structure, etc.) that extends at least partially below deck 18. Frame 24 can be integrally formed with deck 18. Frame 24 is configured to provide structural support for deck 18 of platform assembly 16. Frame 24 can include any number of structural members (e.g., beams, bars, I-beams, etc.) to support deck 18. Frame 24 couples platform assembly 16 with lift assembly 14. Frame 24 may rotatably or pivotally coupled with lift assembly 14 to facilitate rotation of platform assembly 16 about an axis 28 (e.g., a centerline). Frame 24 can also rotatably/pivotally couple with lift assembly 14 such that frame 24 and platform assembly 16 can pivot about an axis 25 (e.g., a centerline).

Platform assembly 16 is configured to be driven to pivot about axis 28 (e.g., rotate about axis 28 in either a clockwise or a counter-clockwise direction) by an electric motor 26 (e.g., a rotary electric actuator, a stepper motor, a platform rotator, a platform electric motor, an electric platform rotator motor, etc.). Electric motor 26 can be configured to drive frame 24 to pivot about axis 28 relative to upper lift arm 32*c* (or relative to intermediate lift arm 32*d*). Electric motor 26 can be configured to drive a gear train to pivot platform assembly 16 about axis 28.

Base assembly 12 includes one or more energy storage devices (e.g., capacitors, batteries, Lithium-Ion batteries, Nickel Cadmium batteries, etc.), shown as batteries 64. Batteries 64 are configured to store energy in a form (e.g., in the form of chemical energy) that can be converted into electrical energy for the various electric motors and electric actuators of lift device 10. Batteries 64 can be stored within base 36. Lift device 10 includes a controller 38 configured to operate any of the electric motors, electric actuators, etc., of lift device 10. Controller 38 can be configured to receive sensory input information from various sensors of lift device 10, user inputs from HMI 20 (or any other user input device such as a key-start or a push-button start), etc. Controller 38 can be configured to generate control signals for the various electric motors, electric actuators, etc., of lift device 10 to operate any of the electric motors, electric actuators, electrically powered movers, etc., of lift device 10. Batteries 64 are configured to power any of the electrical motors, sensors, actuators, electric linear actuators, electrical devices, electrical movers, stepper motors, etc., of lift device 10. Base assembly 12 can include a power circuit including any necessary transformers, resistors, transistors, thermistors, capacitors, etc., to provide appropriate power (e.g., electrical energy with appropriate current and/or appropriate voltage) to any of the electric motors, electric actuators, sensors, electrical devices, etc., of lift device 10.

Batteries 64 are configured to deliver power to electric motors 52 to drive tractive elements 82. A rear set of tractive elements 82 can be configured to pivot to steer lift device 10. In other embodiments, a front set of tractive elements 82 are configured to pivot to steer lift device 10. In still other embodiments, both the front and the rear set of tractive elements 82 are configured to pivot (e.g., independently) to steer lift device 10.

Base assembly 12 can include one or more laterally extending frame members (e.g., laterally extending structural members) and one or more longitudinally extending frame members (e.g., longitudinally extending structural members).

Base assembly 12 includes a steering system 150. Steering system 150 is configured to drive tractive elements 82 to pivot for a turn of lift device 10. Steering system 150 can be configured to pivot tractive elements 82 in pairs (e.g., to pivot a front pair of tractive elements 82), or can be configured to pivot tractive elements 82 independently (e.g., four-wheel steering for tight-turns).

Base assembly 12 can include an HMI 21 (e.g., a user interface, a user input device, a display screen, etc.). In some embodiments, HMI 21 is coupled with base 36. In other embodiments, HMI 21 is positioned on turntable 70. HMI 21 can be positioned on any side or surface of base assembly 12 (e.g., on the front 62 of base 36, on the rear 60 of base 36, etc.).

Referring still to FIG. 1, lift device 10 also includes a battery monitoring system 200. Battery monitoring system 200 can be configured to monitor a status of batteries 64. In some embodiments, battery monitoring system 200 is configured to monitor sensor feedback from one or more battery sensors of batteries 64 and determine a state of charge (SOC) of batteries 64 (e.g., an SOC of each individual battery 64 or of all batteries 64). Batteries 64 can be cooled by a liquid-cooling system. Battery monitoring system 200 can also be configured to identify when the liquid-cooling system of batteries 64 should be refilled.

Battery Monitoring System

Overview

Figure 2:
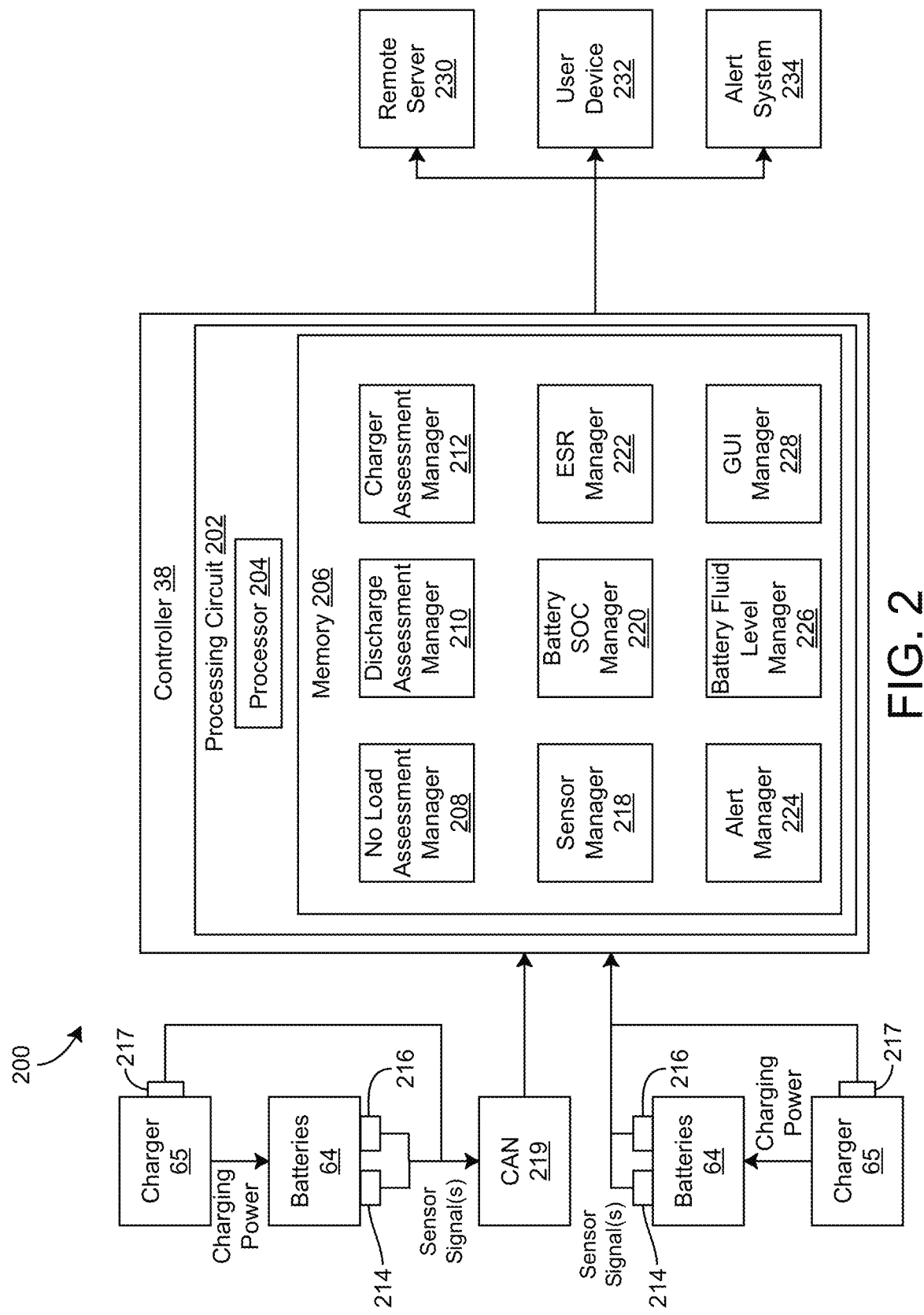
FIG. 2 is a block diagram of a battery monitoring system of the lift device of FIG. 1, according to an exemplary embodiment.

Referring particularly to FIG. 2, battery monitoring system 200 is shown in greater detail, according to an exemplary embodiment. Battery monitoring system 200 includes controller 38 that is communicably coupled with one or more battery sensors 214-216 and a charger sensor 217. Battery sensor 214 and battery sensor 216 can be any type of sensor that is configured to measure voltage, current, resistance, capacitance, temperature, impedance, etc., of batteries 64, or any other properties or parameters of batteries 64. Likewise, charger sensor 217 can be any type of sensor configured to obtain one or more properties (e.g., operational properties) or parameters of charger 65. For example, charger sensor 217 or charger 215 may measure an AC input voltage of electrical or charging energy provided to batteries 64. It should be understood that while only two battery sensors 214 and 216 are shown, any number of battery sensors may be used to monitor various electrical properties of batteries 64 (e.g., more or less than two) that measure, detect, or obtain different types of measurements of batteries 64. Battery sensor 214 may be a different type of sensor than battery sensor 216. For example, battery sensor 214 may be configured to measure voltage across battery 64, while battery sensor 216 is configured to measure current output from battery 64 or temperature of battery 64. Each battery 64 may be equipped with one or more of battery sensor 214 and battery sensor 216 so that sensor data regarding each battery 64 can be obtained. Battery sensors 214-216 may also be or include a sensor configured to measure temperature at battery 64. It should be understood that while only two batteries 64 are shown, controller 38 may be configured to monitor status or perform its functionality for any number of batteries 64 of lift device 10. For example, lift device 10 can include multiple battery racks, each including one or more batteries 64 that are configured to store and provide electrical energy for various operations, accessories, functionality, etc., of lift device 10.

Charger 65 can be configured to obtain connect to a power source and provide batteries 64 with charging power to replenish or recharge batteries 64. In some embodiments, charger 65 is configured to implement its own control decisions locally to charge batteries 64.

In some embodiments, controller 38 is communicably coupled with a controller area network (CAN) bus, shown as CAN 219. CAN 219 can be a pre-existing communications structure or system of lift device 10 and controller 38 may obtain input data (e.g., sensor signal(s)) through CAN 219. Charger sensor 217, battery sensor 214 and battery sensor 216 may be communicably coupled with CAN 219 so that CAN 219 can provide controller 38 with the input data (e.g., the sensor signals).

Controller 38 includes a processing circuit 202, a processor 204, and memory 206. Processing circuit 202 can be communicably connected to a communications interface such that processing circuit 202 and the various components thereof can send and receive data via the communications interface. Processor 204 can be implemented as a general purpose processor, an application specific integrated circuit (ASIC), one or more field programmable gate arrays (FPGAs), a group of processing components, or other suitable electronic processing components.

Memory 206 (e.g., memory, memory unit, storage device, etc.) can include one or more devices (e.g., RAM, ROM, Flash memory, hard disk storage, etc.) for storing data and/or computer code for completing or facilitating the various processes, layers and modules described in the present application. Memory 206 can be or include volatile memory or non-volatile memory. Memory 206 can include database components, object code components, script components, or any other type of information structure for supporting the various activities and information structures described in the present application. According to some embodiments, memory 206 is communicably connected to processor 204 via processing circuit 202 and includes computer code for executing (e.g., by processing circuit 202 and/or processor 204) one or more processes described herein.

Referring still to FIG. 2, memory 206 is shown to include a no load assessment manager 208, a discharge assessment manager 210, a charger assessment manager 212, a sensor manager 218, a battery SOC manager 220, an ESR manager 222, an alert manager 224, a battery fluid level manager 226, and a graphical user interface (GUI) manager 228. No load assessment manager 208 is configured to determine, calculate, estimate, etc., a value of a state of charge of batteries 64 (or a particular battery 64, or multiple of batteries 64, etc.) when batteries 64 are not under a load. The state of charge that is estimated by no load assessment manager 208 is referred to as $SoC_{OCV}$ and is described in greater detail below.

Discharge assessment manager 210 is configured to estimate a state of charge parameter $SoC_{CC}$ using Amp-Hour discharge (AhD) or Coulomb Counting (CC) assessment techniques. The state of charge parameter $SoC_{CC}$ may indicate a state of charge of batteries 64 when batteries 64 are being used to perform machine work or when regenerative energy is provided to batteries 64. Charger assessment manager 212 is configured to estimate, calculate, determine, etc., a state of charge parameter $SoC_{CHRGR}$ of batteries 64 when batteries 64 are currently being charged (e.g., when a charge state, ChrgrState=1). Battery SOC manager 220 is configured to use the parameters $SoC_{CC}$, $SoC_{OCV}$, and $SoC_{CHRGR}$ to determine an overall or a value of a state of charge of batteries 64 that can be reported or used for control decisions of lift device 10. Sensor manager 218 is configured to obtain sensor data from batteries 64, a sensor system of lift device 10, CAN 219, sensors 214-216, etc., for use by controller 38 in determining the various parameters or performing any of its functionality. For example, sensor manager 218 may obtain, receive, calculate, estimate, determine, etc., instantaneous current values, average current values, root mean square current values, instantaneous voltage values, average voltage values, root mean square voltage values, capacitive values, impedance values, etc., that can be used by controller 38 to perform its functionality.

ESR manager 222 is configured to determine an equivalent series resistance (ESR) of batteries 64 and/or a state of health (SOH) of batteries 64. Alert manager 224 can be configured to analyze sensor data (e.g., from batteries 64, sensors 214-216, CAN 219, sensor manager 218, etc.) to detect one or more conditions and provide alerts to a user, a user device, a remote device, a remote server, an administrator, etc. Battery fluid level manager 226 can be configured to determine when a liquid cooling system of batteries 64 should be refilled (e.g., when additional liquid should be added). GUI manager 228 is configured to provide display or control signals for providing reports, GUIs, etc., to notify a user or an administrator or technician regarding any of the calculations, determinations, etc., of controller 38.

Before describing the functionality of the various components of controller 38 in greater detail, various parameters, variables, etc., should be defined. A variable $V_{CALC}$ refers to an average of ten voltage readings across battery 64 taken at 100 millisecond frequency. In some embodiments, $V_{CALC}$ is continuously calculated (e.g., by sensor manager 218, or more generally, by controller 38) every 100 milliseconds and a previous calculation of $V_{CALC}$ is overwritten with a new calculation. Calculating $V_{CALC}$ may advantageously smooth out noise in measurements of voltage across batteries 64 and can be considered as an instantaneous voltage reading or measurement.

A variable $V_{LAST}$ refers to a most recent voltage value that is reported, obtained, measured, detected, etc., from batteries 64. In some embodiments, sensor manager 218 is configured to store $V_{LAST}$ on a buffer since $V_{LAST}$ is not a most recent voltage value but is a voltage value obtained immediately before the most recent voltage value.

A variable $V_{INSTANT}$ is the most recently collected, obtained, measured, detected, etc., voltage value across batteries 64. A variable $SoC_{BATT}$ is a state of charge of batteries 64 (or a particular one of batteries 64) that is broadcasted, calculated, determined, estimated, etc., in a most recent assessment performed by battery SOC manager 220. A variable $Batt_{TEMP}$ is a battery temperature value that is obtained by a polling charger 65 (e.g., obtained from sensors 214-216 by sensor manager 218). A variable $Batt_{RATED}$ is a rated operational temperature or capacity of batteries 64 (or a particular one of batteries 64). The value of Batt RATED may be a predefined, predetermined, etc., value that is stored in memory 206 or obtained from a database based on various operational or manufacturing characteristics of batteries 64. A variable $I_{LOAD}$ refers to a load current that is applied to or drawn from batteries 64. A variable $I_{AVG}$ referes to an average current that is calculated (e.g., by sensor manager 218) based on ten consecutive $I_{LOAD}$ measurements at 250 millisecond intervals.

A variable AhD is a calculated amount of ampere hours that are removed from batteries 64 (or a particular battery 64) under a known load (e.g., a known value of $I_{LOAD}$). A variable ChrgrAhRet is a value obtained by polling charger 65. A variable ChrgrSOC is a value obtained by polling charger 65. A variable $Water_{EVAP}$ refers to an amount of water (e.g., mass, weight, volume, etc.) that has evaporated since a previous water refill of a liquid cooling system of batteries 64. A variable $Water_{VOL}$ is an estimated volume of water that is found in batteries 64 or in a particular battery 64. A variable $Water_{REM}$ is an estimated percent of water remaining in batteries 64 or in a particular battery 64.

In some embodiments, battery SOC manager 220, no load assessment manager 208, discharge assessment manager 210, charger assessment manager 212, ESR manager 222, etc., are configured to perform SOC assessment for batteries 64 or a particular battery 64 or each battery 64 based on several criteria. First, a no load assessment (or an Open-Circuit Voltage: OCR) as performed by no load assessment manager 208 can be performed when applicable (e.g., under particular conditions) and may be stored as $SoC_{OCV}$. An Amp-Hour discharge (AhD) or Coulomb Counting (CC) assessment may be performed by discharge assessment manager 210 when applicable and stored as $SoC_{CC}$ (which may result in a reduction of a SoC of batteries 64). A charger SOC determination can be performed by charger assessment manager 212 when applicable and stored as $SoC_{CHRGR}$. An SOC % range may be from 20%-100%, so that controller 38 considers and reports (e.g., GUI manager 228 may perform reporting functions) any SOC calculations that are below 20% as "LOW" SOC. The state of charge parameter $SoC_{BATT}$ does not change by a value greater than 5% per update. Additionally, the state of charge parameter $SoC_{BATT}$ does not increase during discharge of batteries 64. Finally, the state of charge parameter $SoC_{BATT}$ is updated (e.g., by battery SOC manager 220) every 180,000 milliseconds (ms).

The functionality of controller 38 includes using temperature values and other unit values. Temperature values may have a tolerance of +/−5 degrees Celsius. Values, parameters, or properties with other units may have a tolerance of +/−10% unless otherwise specified.

Sensor Data

Referring still to FIG. 2, sensor manager 218 can be communicably coupled with various CAN-based components for retrieving, obtaining, receiving, etc., values of the variables described herein that are required to compute battery voltage or current (e.g., $V_{CALC}$, $V_{INSTANT}$, $I_{LOAD}$, etc.) or required to compute or determine the parameter $SoC_{BATT}$. Sensor manager 218 may be directly communicably coupled with sensors 214-216 (e.g., a volt meter, a current meter, etc.) or may be indirectly communicably coupled with sensors 214-216 through CAN 219.

Sensor manager 218 is generally configured to obtain any sensor data, voltage values, temperature values, current values, etc., associated with batteries 64 that are required for controller 38 to perform its functionality. For example, sensor manager 218 may be configured to obtain any sensor data required for battery SOC manager 220 to calculate $SoC_{BATT}$.

No Load (Open-Circuit Voltage, OCV) Assessment

Referring still to FIG. 2, memory 206 includes a no load assessment manager 208. No load assessment manager 208 is configured to use various parameters or values of parameters obtained from sensor manager 218 to estimate, calculate, determine, etc., a parameter $SoC_{OCV}$. Specifically, the parameter $SoC_{OCV}$ may indicate a state of charge of battery 64 for no load or an open-circuit voltage. In some embodiments, no load assessment manager 208 only determines or calculates $SoC_{OCV}$ (e.g., performs its functionality) when the following conditions are true:

$$I_{LOAD} < 5 \text{ A (with 180,000 ms delay time)}$$

$$SoC_{Batt} \geq 30\%$$

$$ChrgrState \neq 1 \text{ (with 180,000 ms delay time)}$$

Specifically, no load assessment manager 208 may calculate the parameter $SoC_{OCV}$ only when the current $I_{LOAD}$ is less than 5 amps (with 180,000 millisecond delay time), a value of the parameter $SOC_{BATT}$ is greater than or equal to 30%, and when the batteries 64 are not charging.

If one of the above conditions becomes true during acquisition of the voltage samples (e.g., as performed by sensor manager 218), controller 38 (e.g., sensor manager 218 or no load assessment manager 208) may discard the acquired voltage samples and end the no-load assessment or determination of $SoC_{OCV}$.

No load assessment manager 208 uses the equation below to estimate, calculate, determine, etc., the state of charge parameter $SoC_{OCV}$ when battery 64 is not under a load:

$$SoC_{OCV} = 2.1032 * V_{CALC}^2 - 65.536 * V_{CALC} + 404.1$$

according to some embodiments. No load assessment manager 208 may then multiply the parameter $SoC_{OCV}$ by an appropriate weighting factor as shown in Table 2. If the parameter $SoC_{OCV}$ changes the battery state of charge, $SOC_{BATT}$, by more than 5% after calculating the battery state of charge $SOC_{BATT}$, battery SOC manager 220 may adjust or determine (e.g., clip_ the value of $SOC_{BATT}$ as described in greater detail below.

Amp-Hour Discharge (AhD) or Coulomb Counting (CC) Assessment

Referring still to FIG. 2, discharge assessment manager 210 is configured to determine or estimate a state of charge parameter, $SOC_{CC}$ for battery 64 during measureable loads on battery 64. In some embodiments, discharge assessment manager 210 is configured to use a convention where positive energy or current values indicate positive machine work (e.g., when charge is removed from battery 64, when lift device 10 drives up a hill, etc.) and negative energy or current values indicate regenerative energy being introduced into battery 64 (e.g., when battery 64 is charged).

In some embodiments, discharge assessment manager 210 is configured to compute the parameter $SoC_{CC}$ which accumulates Amp-hr (Ahr %) reduction during measureable loads such as while an average current $I_{AVG} \geq 5$ amps. The average current $I_{AVG}$ is an average calculated from a previous ten $I_{LOAD}$ readings as detected or measured by sensors 214-216 and obtained by sensor manager 218 (e.g., through CAN 219 or directly from sensors 214-216). In some embodiments, discharge assessment manager 210 is configured to update the average current $I_{AVG}$ every 1000 milliseconds and computes an aggregate load discharge $Ah_D$ using the following Equation every second:

$$Ah_D = I_{AVG} * 0.0000277 \left(1 \text{ second of current} * \left(\frac{1 \text{ hr}}{3600 \text{ sec}}\right)\right)$$

The average load discharge $Ah_D$ can then be used by discharge assessment manager 210 in a two part Equation to determine the parameter $SoC_{CC}$ since a previous calculation or assessment of the battery state of charge parameter $SOC_{BATT}$ (as determined by battery SOC manager 220). First, discharge assessment manager 210 can adjust an available battery capacity $Batt_{CAPACITY}$ based on current operational temperature $Batt_{TEMP}$. Then once an overall available energy has been adjusted, discharge assessment manager 210 may calculate the parameter $SoC_{CC}$ by comparing how much energy has been removed from batteries 64 (or a particular one of batteries 64) to how much energy is left in batteries 64 (or a particular one of batteries 64).

Discharge assessment manager 210 uses the Equation:

$$Batt_{CAPACITY} = Batt_{RATED} * (0.012 * Batt_{TEMP} + 0.736)$$

to determine the available battery capacity $Batt_{CAPACITY}$ (e.g., a temperature adjusted battery capacity), where $Batt_{RATED}$ is a rated capacity of battery 64 and $Batt_{TEMP}$ is the operational temperature of battery 64.

Discharge assessment manager 210 uses the Equation shown below to estimate the parameter $SoC_{CC}$ based on Coulomb Counting:

$$SoC_{CC} = SoC_{BATT} - \frac{\left(Batt_{CAPACITY} - \sum (Ah_{dn})\right)}{Batt_{CAPACITY}} * 100$$

where $SoC_{BATT}$ is the state of charge parameter of battery 64 determined, estimated, or calculated by battery SOC manager 220, $Batt_{CAPACITY}$ is the available battery capacity determined by discharge assessment manager 210 using the Equation shown above, and $Ah_{dn}$ is a calculated value of ampere hours that are removed from batteries 64 under a known load.

Under Charge ($SoC_{CHRGR}$) Assessment Criteria

Referring still to FIG. 2, charger assessment manager 212 can be configured to estimate a battery state of charge parameter $SoC_{CHRGR}$ when battery 64 is actively charging (e.g., when ChrgrState=1). In some embodiments, charger assessment manager 212 uses Coulomb-counting techniques to determine a value of the parameter $SoC_{CHRGR}$. In some embodiments, charger assessment manager 212 is configured to perform its respective functionality when battery 64 is actively charging. Charger assessment manager 212 may use conditional logic to determine the value of the parameter $SoC_{CHRGR}$. For example, charger assessment manager 212 may use the Equation:

$$SoC_{CHRGR} = SoC_{BATT} + \frac{ChargrAhRet}{Batt_{CAPACITY}} * 100.$$

$SoC_{BATT}$ Calculation

Referring still to FIG. 2, memory 206 is shown to include a battery SOC manager 220, according to some embodiments. Battery SOC manager 220 is configured to use values of the parameters $SoC_{OCV}$ as determined by no load assessment manager 208, $SoC_{CC}$ as determined by discharge assessment manager 210, and SoC$_{CHRGR}$ as determined by charger assessment manager 212. Battery SOC manager 220 uses the Equation:

$$SoC_{BATT} = a_1 SoC_{OCV} + a_2 SoC_{CC} + a_3 SoC_{CHRGR}$$

where SoC$_{BATT}$ is the state of charge of battery 64, SoC$_{OCV}$ is the state of charge parameter estimated by no load assessment manager 208, SoC$_{CC}$ is the state of charge parameter estimated by discharge assessment manager 210, SoC$_{CHRGR}$ is the state of charge parameter estimated by charger assessment manager 212, and a$_1$, a$_2$, and a$_3$ are parameter weights associated with SoC$_{OCV}$, SoC$_{CC}$, and SoC$_{CHRGR}$, respectively. In some embodiments, the parameter weights are normalized values (e.g., between 0 and 1) or percentage values. In this way, SoC$_{BATT}$ may be a weighted average of the state of charge parameters SoC$_{OCV}$, SoC$_{CC}$, and SoC$_{CHRGR}$. In some embodiments, the parameter weights a$_1$, a$_2$, and a$_3$ are obtained or selected by battery SOC manager 220 from Table 2, shown below. Table 2 may be stored in memory 206 and accessed by battery SOC manager 220 for use in determining the battery state of charge SoC$_{BATT}$. The parameter weights may be constant or time-varying values. In some embodiments, the parameter weights are selected by battery SOC manager 220 based on various conditions or based on modes of the batteries 64.

Table 2 below shows values of the parameters a$_1$, a$_2$, and a$_3$ for various conditions:

TABLE 2

Battery State of Charge Parameters and Weights

| Condition | Parameter | Parameter Weight | |
|---|---|---|---|
| More than 90,000 ms after I$_{LOAD}$ < 5 A, ChrgrState ≠ 1 (reassessed every 180,000 ms) | SoC$_{OCV}$ | Start at 60% (0.60), every 180,000 ms add 5% (0.05), Max at 100% (1.00) | a$_1$ |
|  | SoC$_{CC}$ | Start at 40% (0.40), every 180,000 ms subtract 5% (0.05), Min at 0% (0.00) | a$_2$ |
|  | SoC$_{CHRGR}$ | 0% (0.00) | a$_3$ |
| Less than 90,000 ms after I$_{LOAD}$ < 5 A, ChrgrState ≠ 1, (reassessed every 180,000 ms) | SoC$_{OCV}$ | 20% (0.20) | a$_1$ |
|  | SoC$_{CC}$ | 80% (0.80) | a$_2$ |
|  | SoC$_{CHRGR}$ | 0% (0.00) | a$_3$ |
| I$_{LOAD}$ > 5 A, ChrgrState ≠ 1, (reassessed every 180,000 ms) | SoC$_{OCV}$ | 0% (0.00) | a$_1$ |
|  | SoC$_{CC}$ | 100% (1.00) | a$_2$ |
|  | SoC$_{CHRGR}$ | 0% (0.00) | a$_3$ |
| ChrgrState = 1 (reassessed every 180,000 ms) | SoC$_{OCV}$ | 0% (0.00) | a$_1$ |
|  | SoC$_{CC}$ | 0% (0.00) | a$_2$ |
|  | SoC$_{CHRGR}$ | 100% (1.00) | a$_3$ |

As shown in Table 2 above, the battery state of charge SoC$_{BATT}$ may be equal to the SoC$_{CHRGR}$ parameter as determined by charger assessment manager 212 when ChrgrState=1 (e.g., when battery 64 is being charged) by setting a$_3$=1.00 and setting a$_1$=a$_2$=0.00. Likewise, when the battery 64 is not being charged (e.g., ChrgrState+1), battery SOC manager 220 may select values of the weights a$_1$, a$_2$, and a$_3$ for various conditions (e.g., based on an amount of time since the current I$_{LOAD}$ is less than 5 amps) as shown in Table 2 above. If the current I$_{LOAD}$ is less than 5 amps for at least 90,000 milliseconds, battery SOC manager 220 may set the parameter weight a$_1$ equal to 0.60 initially and increment the parameter weight a$_1$ by 0.05 every 180,000 milliseconds until a maximum of 1.00 is reached or until the conditions (shown in the first column of Table 2) are no longer true. Likewise, if the current I$_{LOAD}$ is less than 5 amps for at least 90,000 milliseconds, battery SOC manager 220 may initially set the parameter weight a$_2$ equal to 0.40 (40% weight) and decrease the parameter a$_2$ by 0.05 (5%) every 180,000 milliseconds until either the parameter weight a$_2$ is equal to the minimum of 0.00 or until the conditions (shown in the first column of Table 2) are no longer true.

In this way, the battery SOC parameter SoC$_{BATT}$ may be a weighted average of the parameters SoC$_{OCV}$, SoC$_{CC}$, and SoC$_{CHRGR}$ or may vary based on time. In some embodiments, battery SOC manager 220 is configured to impose one or more constraints on the value of the parameter SoC$_{BATT}$. For example, battery SOC manager 220 may re-calculate the value of the battery state of charge parameter SoC$_{BATT}$ every 180,000 milliseconds. In some embodiments, battery SOC manager 220 recalculates the battery state of charge parameter SoC$_{BATT}$ every 180,000 milliseconds but does not increase or decrease the value of the battery state of charge parameter SoC$_{BATT}$ by more than 5% of its previous value. For example, battery SOC manager 220 may calculate a new value of the battery state of charge parameter SoC$_{BATT}$ and calculate a percent increase or a percent decrease (e.g., % change) between consecutive calculations of the battery state of charge parameter SOC$_{BATT}$. If the percent increase or the percent decrease is greater than 5%, battery SOC manager 220 may clip the value of the battery state of charge parameter to SoC$_{BATT}$(t)=SoC$_{BATT}$(t−1)+0.05 (SoC$_{BATT}$(t−1)), where SoC$_{BATT}$(t) is the state of charge of battery 64 at a current timestep (e.g., where each timestep is 180,000 milliseconds), and SoC$_{BATT}$(t−1) is the state of charge of battery 64 as determined by battery SOC manager 220 at a previous timestep (e.g., where each timestep is 180,000 milliseconds). If the percent increase or decrease of the battery state of charge parameter is less than 5%, battery SOC manager 220 can use the Equation shown above and Table 2 to obtain a current value of the battery state of charge parameter SoC$_{BATT}$.

In some embodiments, battery SOC manager 220 is also configured to prevent the value of the battery state of charge parameter SoC$_{BATT}$ from increasing between consecutive timesteps (e.g., where each timestep is 180,000 milliseconds or any other value between estimations of the battery state of charge parameter or when battery SOC manager 220 performs its functionality) if the battery 64 is not being charged (e.g., if ChrgrState+1) between consecutive timesteps or between assessments of the battery state of charge (e.g., between times at which battery SOC manager 220 performs its functionality). In this way, battery SOC manager 220 may only overwrite, adjust, increase, etc., the value of the battery state of charge parameter SoC$_{BATT}$ in a positive direction (e.g., between consecutive assessments) if battery 64 has been charged between consecutive assessments of the battery state of charge parameter SOC$_{BATT}$.

Battery SOC manager 220 can also be configured to use a stored value of SoC$_{BATT}$ for reporting, control decisions, etc., prior to performing a first SOC assessment (e.g., prior to the first time battery SOC manager 220 performs its functionality). In some embodiments, after ignition of lift device 10 is performed, battery SOC manager 220 is configured to perform an initial SOC assessment. Battery SOC manager 220 may wait for 10,000 milliseconds after the ignition of lift device 10, and capture a voltage across batteries 64 or across each battery 64 after no load assessment manager 208 has performed its functionality. Battery SOC manager 220 may abort performing the initial SOC assessment and revert a previously determined, calculated, used, stored, etc., value of $SoC_{BATT}$ if $I_{LOAD}$>5 Amps during the initial or first SOC assessment. Battery SOC manager 220 may limit the initial determination of $SoC_{BATT}$ to a maximum of a 5% change from a previous value of $SoC_{BATT}$.

Equivalent Series Resistance (ESR) Assessment

Referring still to FIG. 2, memory 206 includes ESR manager 222 that is configured to determine a state of health (SOH) of battery 64 (or multiple batteries 64) by performing an ESR technique. ESR manager 222 may take into account temperature and SOC fluctuations as well as an age of batteries 64 to determine ESR and SOH of battery 64.

ESR manager 222 can be configured to take a voltage reading of battery 64 prior to a function of battery 64 being triggered (e.g., charging or discharging), then take another voltage reading during the function. ESR manager 222 may be configured to determine a difference between the voltage before the function is triggered and during the function and divide the difference by a value of a current that causes the voltage difference (e.g., a voltage drop). ESR manager 222 uses the Equation shown below to calculate the ESR:

$$ESR = \frac{(V_{LAST} - V_{INSTANT})}{I_{LOAD}}$$

where $V_{LAST}$ is the voltage across battery 64 prior to the function being triggered, $V_{INSTANT}$ is the voltage across battery 64 as the function is performed, and $I_{LOAD}$ is the current that causes the voltage drop (e.g., $V_{LAST}-V_{INSTANT}$). In some embodiments, ESR manager 222 calculates the ESR subject to a constraint: 80 amps<$I_{AVG}$<100 amps for a time no less than 5 seconds and no greater than 30 seconds (e.g., where $I_{AVG}$ is the average current over this time interval). Each time ESR manager 222 determines the ESR, ESR manager 222 categorizes the ESR (e.g., selects a corresponding one of categories A, B, C, D, . . . , P) using Table 3, shown below. ESR manager 222 can use a temperature of battery 64 (e.g., $Batt_{TEMP}$) and the state of charge of battery 64 (e.g., $SoC_{BATT}$) to identify the category for the calculated ESR as shown in Table 3 below.

TABLE 3

| | ESR Categories | | | |
| --- | --- | --- | --- | --- |
| ESR Categories | $SoC_{BATT}$ < 20% | 20 < $SoC_{BATT}$ < 50% | 50% < $SoC_{BATT}$ < 75% | 75 < $SoC_{BATT}$ < 100% |
| −20° C. < $Batt_{TEMP}$ < ° C. | A | B | C | D |
| 0° C. < $Batt_{TEMP}$ < 5° C. | E | F | G | H |
| 5° C. < $Batt_{TEMP}$ < 20° C. | I | J | K | L |
| $Batt_{TEMP}$ > 20° C. | M | N | O | P |

ESR manager 222 may categorize each ESR calculation or ESR reading and store an initial ESR value and a running ESR value. In some embodiments, ESR manager 222 may compare the running ESR value to the running ESR value. ESR manager 222 is configured to calculate or determine the initial ESR value and the running ESR value using the Equations shown below:

$ESR_{INITIAL}$ = Average of first 20 *ESR* readings $ESR_{RUNNING}$ = Average of last 20 *ESR* readings according to some embodiments. In some embodiments, if $ESR_{RUNNING}$>150% of $ESR_{INITIAL}$ for any of the respective categories as shown in Table 3 above, ESR manager 222 may determine that the SOH of battery 64 is poor.

Battery Fluid Level

Referring still to FIG. 2, battery fluid level manager 226 is configured to determine a level of batteries 64 or a liquid cooling system of batteries 64. Battery fluid level manager 226 can be configured to estimate, calculate, determine, etc., the liquid level of batteries 64 to determine if liquid levels are low or if the liquid cooling system should be refilled. Battery fluid level manager 226 can provide indications of low or high fluid level to alert manager 224 and/or GUI manager 228 to provide a user with notifications regarding when the liquid cooling system should be refilled or to determine an amount of an electrolyte (e.g., water) that is remaining in battery 64. Battery fluid level manager 226 can use the equation below to determine a volume of electrolyte remaining in battery 64 at time t:

$$V_{electrolyte}(t) = V_{electrolyte}(t-\Delta t) - \text{Electrolyte}_{evolution,rate}\Delta t$$

where $V_{electrolyte}(t)$ is the amount of the electrolyte remaining in battery 64 at time t (e.g., in gallons, milliliters, volume, mass, etc.), $V_{electrolyte}(t-\Delta t)$ is a previously determined amount of the electrolyte remaining in battery 64 (at time t−Δt), $\text{Electrolyte}_{evolution,rate}$ is a rate of evolution of the electrolyte with respect to time (e.g., in gallons per hour), and Δt is the amount of time elapsed between the time t−Δt and the present time t. For example, the rate of evolution of the electrolyte with respect to time may be a predetermined or fixed value (e.g., 0.0026 gallons/hour) or may be a value that is determined by battery fluid level manager 226.

Battery fluid level manager 226 can also be configured to determine a percentage or a ratio (electrolyte volume remaining percentage, EVRP) of electrolyte volume remaining with respect to a maximum amount of the electrolyte that batteries 64 can hold. Battery fluid level manager 226 can use the following Equation to estimate the remaining electrolyte percentage:

$$EVRP = \frac{(V_{electrolyte}(t) - \text{Electrolyte}_{evolution,rate}\Delta t)}{V_{electrolyte,max}}$$

where $V_{electrolyte}(t)$ is the amount (e.g., volume) of electrolyte remaining in batteries 64 at time t, $\text{Electrolyte}_{evolution,rate}$ is the rate of evolution of the electrolyte with respect to time (e.g., in gallons per hour), Δt is the amount of time elapsed, and $V_{electrolyte,max}$ is a maximum amount of electrolyte (e.g., water) that batteries 64 or the liquid cooling system of batteries 64 can hold.

In some embodiments, battery fluid level manager 226 uses a value of zero for EVRP until a refill date parameter (e.g., 'Last Refill Date') is set by a user (e.g., via a mobile application of user device 232). Once the refill data parameter is set by the user, the value of EVRP is set to 100% by battery fluid level manager 226 and any use of lift device 10, batteries 64, or the charger of batteries 64 thereafter results in a subtraction from the value of the EVRP.

In some embodiments, battery fluid level manager 226 only uses the above two Equations when batteries 64 are being charged (e.g., ChrgrState=1) and SoC$_{BATT}$>80%.

Figures 29, 30:
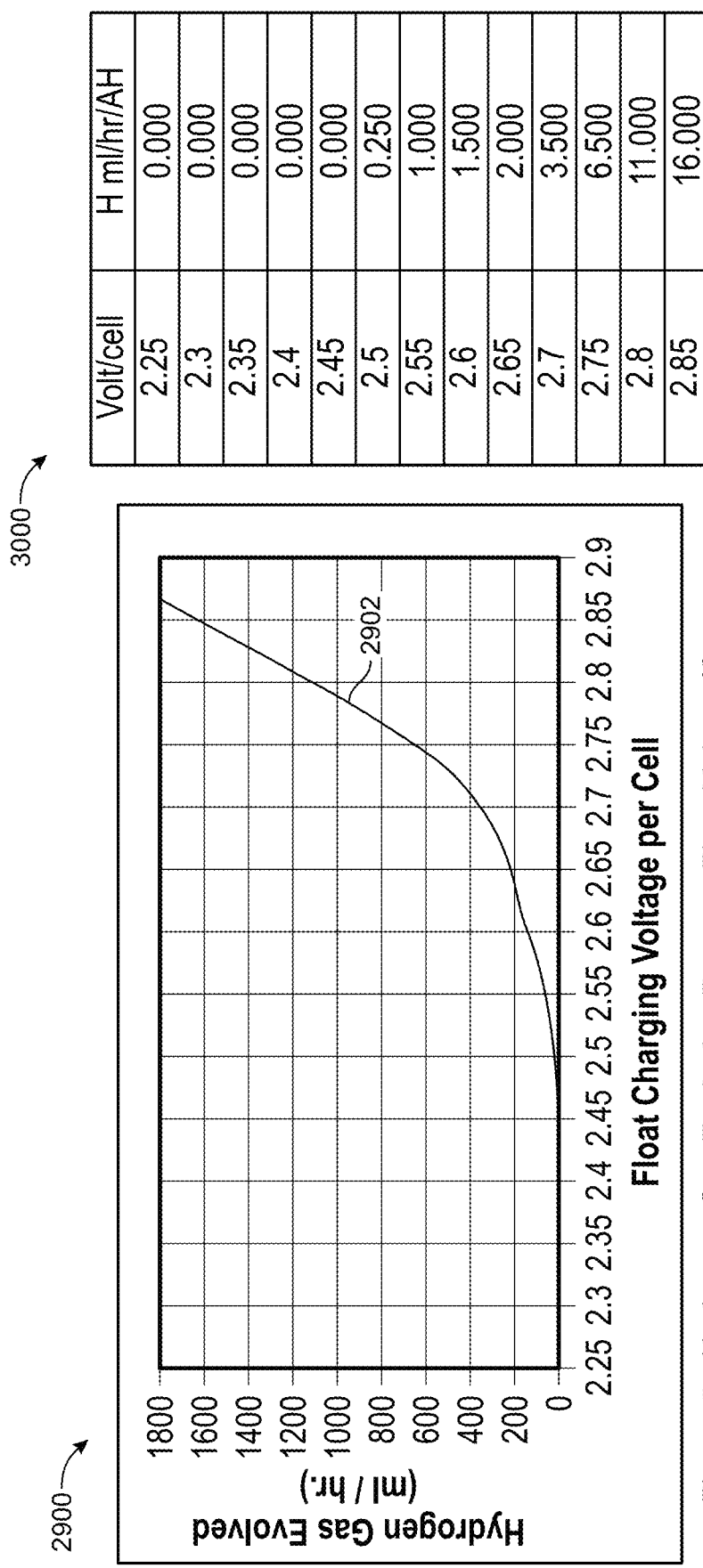
FIG. 29 is a graph showing a relationship between hydrogen gas evolution and a float charging voltage per cell of a battery, according to an exemplary embodiment.
FIG. 30 is a table showing values of the relationship of FIG. 29, according to an exemplary embodiment.
Figures 31, 32:
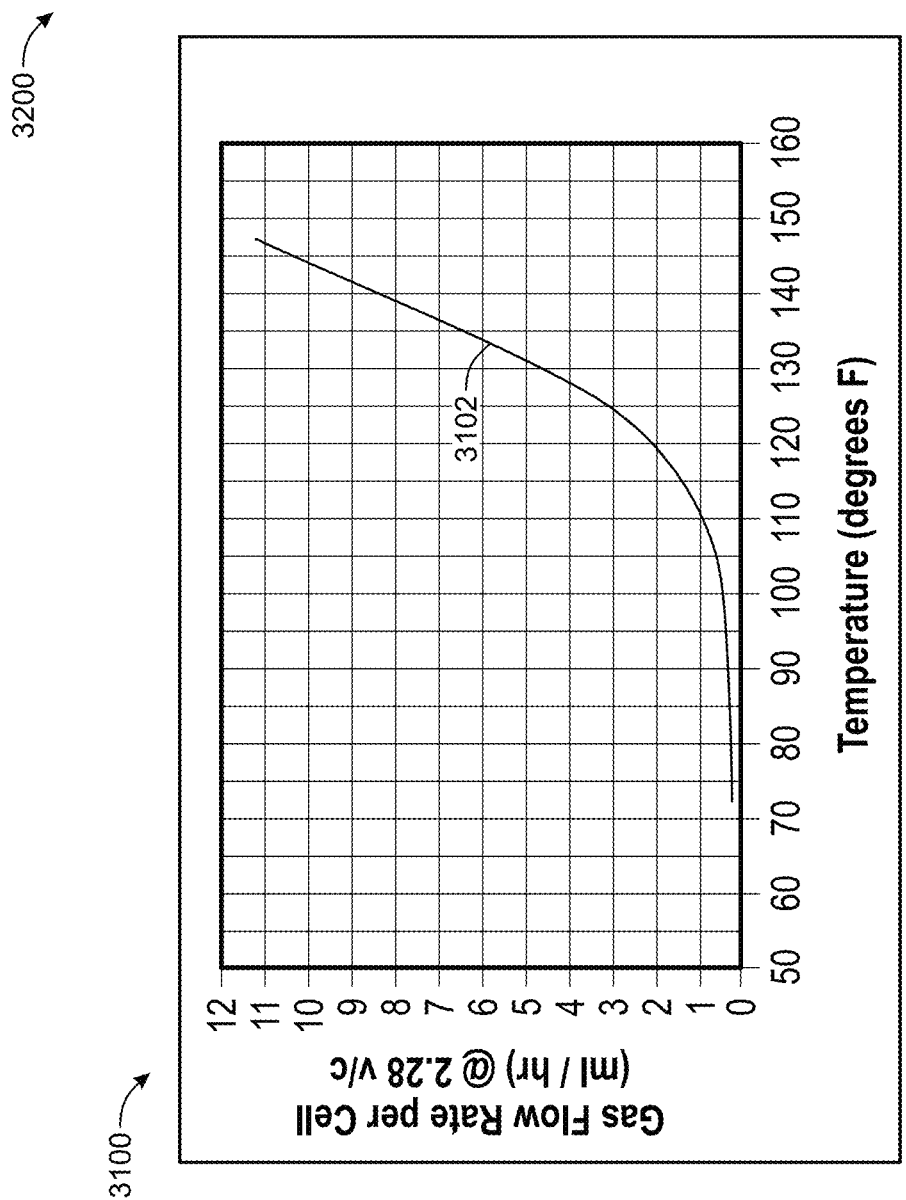
FIG. 31 is a graph showing a relationship between gas flow rate per cell of a battery and a temperature of the battery, according to an exemplary embodiment.
FIG. 32 is a table showing values of the relationship of FIG. 31, according to an exemplary embodiment.
Figure 33:
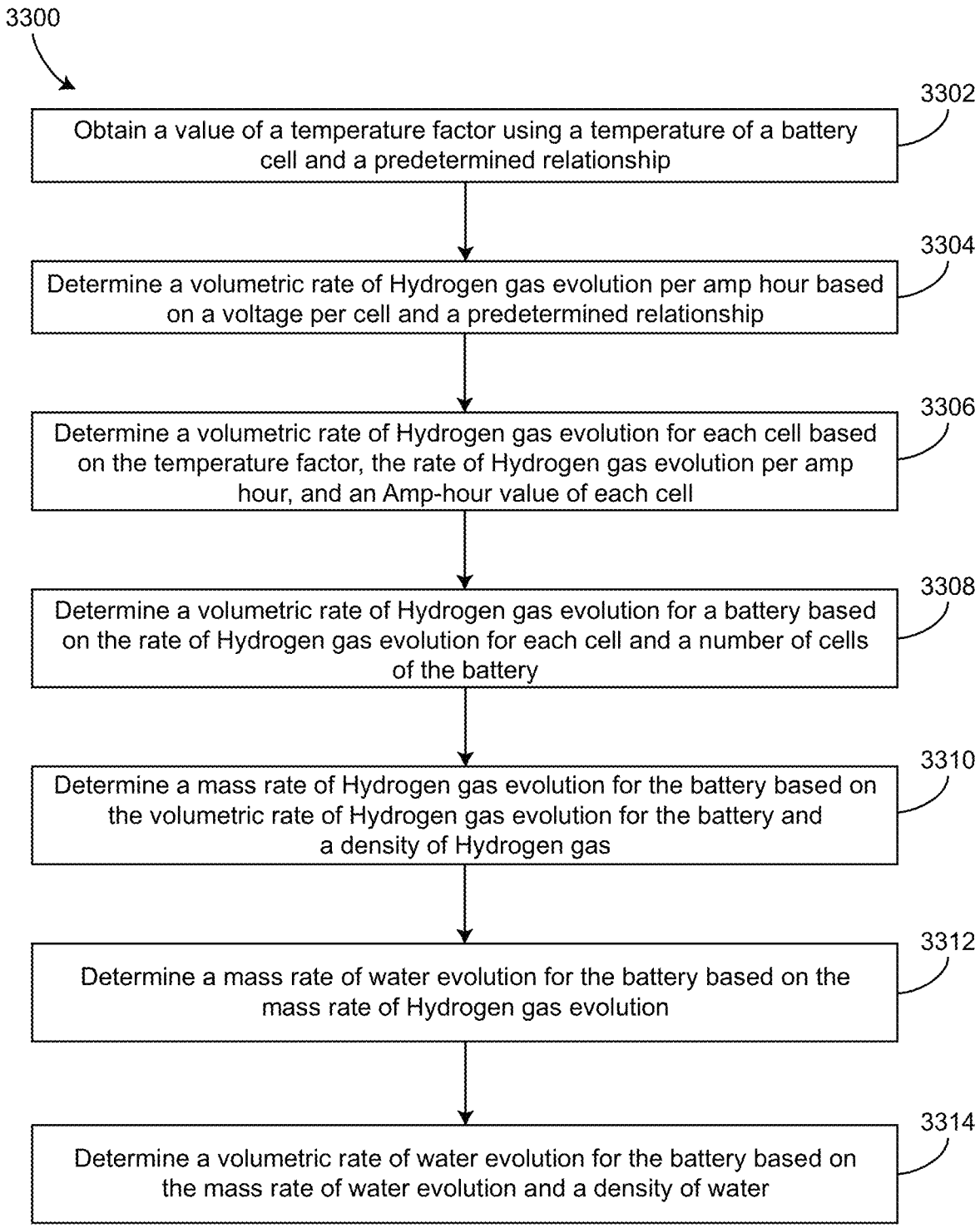
FIG. 33 is a flow diagram of a process for determining a rate of water evolution of a battery, according to an exemplary embodiment.

Referring particularly to FIGS. 2 and 29-33, battery fluid level manager 226 can be configured to estimate the evolution or rate of change of volume of the electrolyte in the batteries 64 using process 3300, a relationship between hydrogen gas evolution rate and float voltage/current as represented by series 2902 of graph 2900 shown in FIG. 29 and table 3000 as shown in FIG. 30, and a relationship between battery hydrogen gas emission rate versus temperature as represented by series 3102 of graph 3100 of FIG. 31 and table 3200 shown in FIG. 32.

Process 3300 includes obtaining a value of a temperature factor using a temperature of a battery cell and a predetermined relationship (step 3300), according to some embodiments. Battery fluid level manager 226 can use table 3200 as shown in FIG. 32 to obtain the value of the temperature factor of a battery cell or of a cell of batteries 64. The temperature of the battery cell can be obtained from battery sensor 214 or battery sensor 216 (e.g., a temperature sensor).

Process 3300 includes determining a volumetric rate of Hydrogen gas evolution per amp hour based on a voltage per cell and a predetermined relationship (step 3304), according to some embodiments. The voltage per cell may be a measured value obtained from battery sensor 214 and/or battery sensor 216 or may be a rated/stored value. Step 3304 can be performed by battery fluid level manager 226 using the relationship represented by series 2902 in graph 2900 of FIG. 29 and represented by table 3000 (e.g., including interpolation or extrapolation if necessary).

Process 3300 includes determining a volumetric rate of Hydrogen gas evolution for each cell of battery 64 based on the temperature factor, the rate of Hydrogen gas evolution per amp hour, and an Amp-hour value of each cell (step 3306), according to some embodiments. Step 3306 can be performed by battery fluid level manager 226 by multiplying the volumetric rate of Hydrogen gas evolution per amp hour by the temperature factor and an Amp-hour (e.g., a measured value) of a cell of battery 64.

Process 3300 includes determining a volumetric rate of Hydrogen gas evolution for battery 64 based on the rate of Hydrogen gas evolution for each cell and a number of cells of the battery 64 (step 3308), according to some embodiments. Step 3308 can be performed by battery fluid level manager 226 by multiplying the volumetric rate of Hydrogen gas evolution for each cell by a number of cells of battery 64 (e.g., a predetermined, stored, retrieved value, etc.).

Process 3300 includes determining a mass rate of Hydrogen gas evolution for the battery based on the volumetric rate of Hydrogen gas evolution for the battery (e.g., battery 64) and a density of Hydrogen gas (step 3310), according to some embodiments. Step 3310 can be performed by battery fluid level manager 226 by multiplying the volumetric rate of Hydrogen gas evolution for the battery (e.g., battery 64) by a density of Hydrogen (e.g., at 1 atm and 273 K).

Process 3300 includes determining a mass rate of water evolution for the battery based on the mass rate of Hydrogen gas evolution (step 3312), according to some embodiments. Step 3312 can be performed by battery fluid level manager 226.

Process 3300 includes determining a volumetric rate of water evolution for the battery based on the mass rate of water evolution and a density of water (step 3314), according to some embodiments. Step 3314 can be performed by battery fluid level manager 226.

Battery Alerts

Referring still to FIG. 2, alert manager 224 can be configured to use sensor data or values of variables, parameters, etc., calculated by controller 38 to identify if an alert should be provided to a user device 232 (e.g., a mobile device, a smartphone, a tablet, a personal computer device, etc.), a remote server 230 (e.g., a cloud computing system, a remote computer, etc.), and an alert system 234, etc. In some embodiments, controller 38 is communicably coupled with any of remote server 230, user device 232, or alert system 234 (e.g., wiredly or wirelessly) so that controller 38 can provide alerts, alarms, notifications, reports, output data, etc., to an external device, a user, a display system, an alert system, etc. Alert system 234 may include light emitting devices, display screens, sound emitting devices, etc., and can be operated by controller 38, or more particularly by alert manager 224.

There are two distinct alerts that are specific to battery monitoring system 200 that can be detected by controller 38 (or more particularly by alert manager 224). Alerts may come from the charger 65, and alerts may be generate within controller 38 or CAN 219. These alerts may be displayed within the mobile application at user device 232 along with machine level DTC's. Any code coming from the charger 65 should reference a Delta-Q code directly then look up the description of the code in the code and attach within the mobile application. All machine level DTC's again can be transferred through the controller 38 and joined with description within the mobile application. Any codes specific to battery monitoring system 200 can be generated within the controller 38 based on Tables 4 or 5 below. Controller 38 can keep a running counter of all fault codes within the battery monitoring system 200. These values can be mapped or tied to a battery installation date field in the mobile application. Controller 38 may clear counters when battery install date is reset (e.g., by a user input at user device 232).

In some embodiments, alert manager 225 is configured to use the following Equation to determine a freeze warning:

$$\text{Freeze}_{TEMP}(° \text{ C.}) = -73.657218171 * SoC_{BATT}^3 + 37.8675295012 * SoC_{BATT}^2 - 27.4519593793 * SoC_{BATT} - 1.142084849$$

In some embodiments, alert manager 225 is configured to use the following Equation to determine a low or poor SOC charging practice:

Chrg$_{LOWSOC}$=average of all values used in last five cycles of time series chart Alert manager 225 can be configured to identify events, alerts, conditions, etc., that result from charger 65, or alerts that are generated within controller 38 or any other CAN device. These alerts may be provided to user device 232 (e.g., by GUI manager 228, alert manager 225, or any combination thereof). In some embodiments, alert manager 225 is also configured to keep a running counter of all fault codes that a particular battery 64 triggers over its lifetime. In some embodiments, the fault codes are mapped or tied to a battery instillation date field or value in a mobile application that is provided to the user through user device 232. In some embodiments, if the battery installation date is reset (e.g., by receiving a user input from user device 232 through the mobile application), the counter for the corresponding battery 64 is also reset or cleared. Table 4 below shows various alerts that can be provided to the user via the user device 232. Specifically, Table 4 includes a column indicating a topic name that is displayed on a screen of the user device 232 (e.g., in the mobile application), a topic data that is displayed by the mobile application, and a machine/component signal or parameters that are associated with the alert:

TABLE 4

Displayable Alerts

| Topic Name in App Screen | Topic Data Displayed by App | Machine/Component Signal |
|---|---|---|
| Freeze Warning | Freeze Warning- Battery has potential of freezing electrolyte | $Batt_{TEMP} \leq FreezeTEMP$ AND $ChrgrState \neq 1$ |
| Low Water Warning | Electrolyte level is predicted to be low, check battery electrolyte level | $EVRP < 20\%$ |
| Discharged battery | | $SoCBATT \leq 20\%$ |
| Deeply discharged battery | | $SoCBATT \leq 10\%$ |
| Low SOC charging practices | Last 5 charge cycles show poor charging practices, consider complete battery charge | $Chrg_{LOWSOC} \leq 20\%$ |
| Poor battery health | | $ESR_{RUNNING} > 150\%$ of $ESR_{INITIAL}$ |

Alert manager 224 can also be configured to detect various errors associated with charger 65 of batteries 64. Table 5 below shows various errors or charger faults that alert manager 224 or controller 38 can be configured to detect and can be displayed to the user via user device 232 (e.g., through the mobile application):

TABLE 5

Charger Faults

| Error # | Description | Code | Displayed Text |
|---|---|---|---|
| E001 | High Battery Voltage Error | 44137 | BATTERY CHARGER- HIGH BATTERY VOLTAGE ERROR |
| E002 | Low Battery Voltage Error detected prior to starting a charge cycle | 44138 | BATTERY CHARGER- BATTERY VOLTAGE TOO LOW FOR CHARGE |
| E003 | Charge Timeout | 44139 | BATTERY CHARGER- CHARGE TIMOUT OCCURRED |
| E004 | Battery defective | N/A | |
| E005 | Not Used | N/A | |
| E006 | Battery temperature sensor is required by algorithm and settings but it is shorted to ground. | N/A | |
| E007 | Ah Limit Exceeded | 44141 | BATTERY CHARGER- AMP HOUR LIMIT EXCEEDED |
| E008 | Battery Temperature Out of Range | 44142 | BATTERY CHARGER- BATTERY TEMPERATURE SENSOR OUT OF RANGE |
| E009 | Suspicious Battery Temp change rate or Dynamic computated Correction R. | N/A | |
| E010 | DC Short Circuit | N/A | |
| E011 | Charger is disabled by external command | N/A | |
| E012 | Reverse Polarity | 44143 | BATTERY CHARGER- BATTERY VOLTAGE POLAIRTY REVERSED |
| E013 | Battery Does not take current | 44136 | BATTERY CHARGER- FAULT (SPN:FMI) |
| E014 | Number Of Cells calculated or being set from platform is suspicious | 44136 | BATTERY CHARGER- FAULT (SPN:FMI) |
| E015 | Platform has its target voltage set, but Algo (no EOC voltage in header) does not support voltage scaling | 44136 | BATTERY CHARGER- FAULT (SPN:FMI) |
| E016 | Software upgrade failed | 44136 | BATTERY CHARGER- FAULT (SPN:FMI) |
| E017 | USB mount or unmount error | 44136 | BATTERY CHARGER- FAULT (SPN:FMI) |
| E018 | Slot CRC Error | 44136 | BATTERY CHARGER- FAULT (SPN:FMI) |
| E019 | HW Build does not support SW version | 44136 | BATTERY CHARGER- FAULT (SPN:FMI) |
| E020 | No active algo selected | 44144 | BATTERY CHARGER- ALGORITHM NOT SET |

TABLE 5-continued

Charger Faults

| Error # | Description | Code | Displayed Text |
|---|---|---|---|
| E021 | High Battery Voltage Error detected while charging | N/A | |
| E022 | Low Battery Voltage Error detected while charging | N/A | |
| E023 | High AC Voltage Error, >270 VAC | 44147 | BATTERY CHARGER-AC SUPPLY VOLTAGE TOO HIGH |
| E024 | Failure to initialize | 44136 | |
| E025 | Low AC Voltage Oscillation Error | 44148 | BATTERY CHARGER-AC SUPPLY VOLTAGE TOO LOW |
| E026 | USB Script Failure | 44136 | BATTERY CHARGER-FAULT (SPN:FMI) |
| E027 | USB Over Current Fault | 44136 | BATTERY CHARGER-FAULT (SPN:FMI) |
| E028 | Incompatible Algorithm | 44136 | BATTERY CHARGER-FAULT (SPN:FMI) |
| E029 | CAN Bus error | 44136 | BATTERY CHARGER-FAULT (SPN:FMI) |
| E030 | Battery Module error | 44136 | BATTERY CHARGER-FAULT (SPN:FMI) |
| E031 | The Vref for the ADC measurements has triggered an alarm | 44136 | BATTERY CHARGER-FAULT (SPN:FMI) |
| E032 | CAN Heartbeat Lost | 44136 | BATTERY CHARGER-FAULT (SPN:FMI) |
| E033 | Target Voltage set is higher than the hardware can support | N/A | |
| E034 | Battery Capacity is set on platform, but ALG does not support current scale. | 44136 | BATTERY CHARGER-FAULT (SPN:FMI) |
| E035 | Target Voltage set is too low for the hardware | 44136 | BATTERY CHARGER-FAULT (SPN:FMI) |
| E036 | Battery Temperature sensor is required by algorithm and settings but it is not installed. | 44149 | BATTERY CHARGER-BATTERY TEMPERATURE SENSOR NOT INSTALLED |
| E037 | CANOpen reprogramming failed | 44136 | BATTERY CHARGER-FAULT (SPN:FMI) |
| E038 | Fan either has a locked rotor or open circuit | 44136 | BATTERY CHARGER-FAULT (SPN:FMI) |
| E039 | The button is stuck down | 44136 | BATTERY CHARGER-FAULT (SPN:FMI) |
| E040 | The fan power supply outputs voltage lower than expected | 44136 | BATTERY CHARGER-FAULT (SPN:FMI) |
| E041 | Software internal error | 44136 | BATTERY CHARGER-FAULT (SPN:FMI) |
| E042 | CAN configuration error | 44136 | BATTERY CHARGER-FAULT (SPN:FMI) |
| E043 | CANopen PDO CRC error | N/A | |
| E044 | CANopen PDO sequence count error | N/A | |
| E045 | Battery not connected before charging | 44150 | BATTERY CHARGER-BATTERY DISCONNECTED |
| E046 | Invalid PDO Length | N/A | |
| E047 | Charger overvoltage alarm | 44136 | BATTERY CHARGER-FAULT (SPN:FMI) |
| E048 | Charger parallel charging found multiple master on the same bus. | 44136 | BATTERY CHARGER-FAULT (SPN:FMI) |
| E049 | Insufficient resources-typically due to their being more slaves on the bus than the master expects or can cope with. | 44136 | BATTERY CHARGER-FAULT (SPN:FMI) |
| E050 | A parallel charging disabled unit has received Parallel charging specific CAN messages | 44136 | BATTERY CHARGER-FAULT (SPN:FMI) |
| E051 | A Parallel charging enabled slave unit has not detected a Master device on the CAN bus | 44136 | BATTERY CHARGER-FAULT (SPN:FMI) |
| E052 | A Parallel charging enabled master has not detected the expected number of slaves on the CAN bus | 44136 | BATTERY CHARGER-FAULT (SPN:FMI) |
| E053 | A Parallel charging slave has stopped communicating with the master | 44136 | BATTERY CHARGER-FAULT (SPN:FMI) |
| E054 | A Slave has reported reverse polarity to the Master | 44136 | BATTERY CHARGER-FAULT (SPN:FMI) |
| E055 | There is an excessive voltage reading difference between Master and Slave. | 44136 | BATTERY CHARGER-FAULT (SPN:FMI) |

TABLE 5-continued

Charger Faults

| Error # | Description | Code | Displayed Text |
|---|---|---|---|
| E056 | A Parallel charging slave has unexpectedly stopped charging but is still in communication with the master | 44136 | BATTERY CHARGER-FAULT (SPN:FMI) |
| E057 | BMS did not respond to charger | N/A | |
| E058 | Network Management (NM) Down Event; There was an NM messaging error/timeout | N/A | |
| E059 | Another J1939 device detected with the same address and that device does not comply with the address claim procedures | N/A | |
| E060 | An expected message (i.e., with a receive timeout; e.g., RPDO or PGN) has not been received from the BMS yet, but the charger is ready to start | N/A | |
| E061 | BMS sensed current differ from charger sensed current | N/A | |
| E062 | BMS sensed voltage differ from charger sensed voltage | N/A | |
| E063 | Platform parallel charging: The master has detected an incompatible slave on the bus. | N/A | |
| E064 | The device cannot claim, or has lost its J1939 address. | N/A | |
| E065 | Another device on the bus cannot claim, or has lost its J1939 address. | N/A | |
| E066 | Sensed voltage higher than expected | | |
| E067 | CAN Bus error | | |
| E068 | Network Message Lost | | |

Data Reporting

Referring to FIG. 2. controller 38 includes GUI manager 228 that is configured to output, report, provide, etc., any data, parameters, battery properties. SOC parameters. SOC values, etc., to user device 232 via a mobile application. GUI manager 228 can be configured to also provide any of the collected data, calculated data, parameters, battery parameters, battery properties, SOC parameters, etc., as determined, obtained, estimated, or calculated by controller 38 to a remote server 230. Remote server 230 can be configured to obtain data from multiple of controllers 38 across a fleet of lift devices 10 and may perform any of the functionality of GUI manager 228 to provide reports to user device 232 regarding the fleet of lift devices 10 (e.g., via the mobile application). GUI manager 228 can be wirelessly communicably coupled with user device 232 via Bluetooth, LoRa, Zigbee, a wireless transceiver, a cellular dongle, a wireless radio, a transmitter, etc.

In some embodiments, controller 38 is configured to obtain data from a fleet of lift devices 10 and may generate a set of "fleet" data, along with performing its functionality (e.g., to determine SOC of various batteries 64 of the lift devices 10 of the fleet). The fleet data may include multiplexed advertising information including serial number, company name, device name, device ID, lift device ID, etc. The data that is output by controller 38 (e.g., data relating to a particular lift device 10 or a fleet of lift devices 10) may be provided as a packet. A user may select a particular lift device 10 through a GUI that displays the fleet of lift devices 10. Controller 38 can receive the user selection and may provide user device 232 with data or calculations corresponding to the selected lift device 10 (e.g., including serial number, ID number, company, manufacturer, specifications, etc.). In some embodiments, a serial number and/or asset ID of lift device 10 is writable by the user via user device 232 and the mobile application.

In some embodiments, fleet information or fleet data is updated upon opening of the mobile application at user device 232 (e.g., by selecting a battery icon at user device 232) and reloaded only from a manual down swipe on a screen of user device 232. This may cause any previous information that was present on the screen to be replaced by the relevant active information. If a particular lift device 10 no longer has a signal when attempting to transition from a fleet to a machine screen, the mobile application may indicate a form of "Not Available." Table 6 below shows fleet information that can be displayed via user device 232:

TABLE 6

Fleet Information

| Topic Name in Mobile Application Screen | Topic Data Displayed by Application | Bluetooth Low Energy (BLE) Signal | Machine/Component Signal |
|---|---|---|---|
| Model | Machine Model | Ref 5 Enum document | Ref 3, Can VehModel (stored in machine controller) |

TABLE 6-continued

Fleet Information

| Topic Name in Mobile Application Screen | Topic Data Displayed by Application | Bluetooth Low Energy (BLE) Signal | Machine/Component Signal |
|---|---|---|---|
| Asset ID | Asset ID (primary; stored in BLE) Machine S/N (secondary; stored in machine controller) CAN2BLE S/N (tertiary; stored in BLE at time of manufacture) | Ref 2 Interface document, with primary → tertiary populated if not blank | ES → PeCAN Word (0x0005, LS; 0x0006, MS) R → Pat??? |
| (SOC % graphically and numerically represented) | Battery State of Charge for >20-100% [80-100% (green); 21-79% (black)] show SOC % Battery State of charge for ≤ [Discharged for >10% to ≤20% (red bar)] show "LOW" instead of SOC % [Deeply Discharged ≤ 10% (red)] show "LOW" instead of SOC % | $SOC_{BATT}$ as computed in Section 3 (stored in BLE) | |
| (AC Connection Status graphically represented) | Display: Gray = AC Not Connected Yellow = (AC Connected) + (any connected condition ≠ Green) Green = (AC Connected) + (AC Input Volts > 80 V) + (ChargerState = 0, 1, 2) | Ref 2 Interface document | ChrgrFBBCH1ACState from Ref 7 BCH1 |
| (Alerts Active graphically represented) | Display ⚠ if machine DTC, charger DTC or BMMS DTC exists | BMMS DTC (stored in BLE) | ES → PeCAN Byte (0x00F2 MS; 0x00F3, LS) R → Pat??? Charger→Reported as DM1 from SA=0x49 (stored in charger) |

Once a user selects a particular lift device through user device 232 (e.g., via the mobile application) from a fleet screen, the mobile application may initiate a pairing connection. The information shown in the Table 7 below may be updated in response to a manual reset by a swipe down on the screen of user device 232. Specifically, controller 38 can provide user device 232 with any of a model of lift device 10, an asset ID of lift device 10, an AC connection status, a charging voltage (e.g., AC volts), a charger state, a battery type, a battery size, $SoC_{BATT}$, a charger algorithm ID, an estimated battery maintenance percentage, a last battery maintenance, or alerts as shown in Table 7 below. User device 232 can graphically, textually, or otherwise display any of the herein described information.

TABLE 7

Data Displayed by Specific Lift Device

| Topic Name in Mobile Application Screen | Topic Data Displayed by Mobile Application | Bluetooth Low Energy (BLE) Signal | Machine/Component Signal |
|---|---|---|---|
| Model | Machine Model | Ref 5 Enum document | ES → PeCAN Byte (0x00A0) 0 = 1230ES/1 = 1930ES/ 2 = 2030ES/3 = 2630ES/ 4 = 2646ES/5 = 3246ES R → Pat??? (stored in machine controller) |
| Asset ID | Asset ID (primary; stored in BLE) Machine S/N (secondary; stored in machine controller) CAN2BLE S/N (tertiary; stored in BLE at time of manufacture) | Ref 2 Interface document, with primary → tertiary populated if not blank | ES → PeCAN Word (0x0005, LS; 0x0006, MS) R → Pat??? |

TABLE 7-continued

Data Displayed by Specific Lift Device

| Topic Name in Mobile Application Screen | Topic Data Displayed by Mobile Application | Bluetooth Low Energy (BLE) Signal | Machine/Component Signal |
|---|---|---|---|
| (AC Connection Status graphically represented) | Disconnected (00): grayscale unplugged symbol with Ø symbol<br>Connected, but issue (02, 03, VAC < 120): yellow plugged in symbol<br>Connected, (VAC > 119): green plugged in symbol | | ChrgrFBBCH1ACState from Ref 7 BCH1 |
| AC Volts | Show value in black if >0<br>Show null symbol if value = 0 | | Directed Spatial to Charger 0x7F001 (Ref 8) |
| Charger State | Shown graphically with lightning bolt<br>Green: charging (01)<br>Yellow: not charging (02, 13, 14)<br>Not shown: Disconnected (00) | | BCH1 Charger State |
| Battery Type | Display either line of text below:<br>Flooded Lead Acid (FLA)<br>Absorbent Glass Mat (AGM) | | ES → PeCAN Byte (0x00A5)<br>0 = Flooded/1 = AGM<br>R → Pat???<br>(stored in machine controller) |
| Battery Size | Display value retrieved from machine controller with Ah unit displayed after value | | ES → PeCAN Byte (0x00AD)<br>0 = 220/1 = 200/2 = 245/3 = Other<br>0 = 220/1 = Other<br>R → Pat???<br>(stored in machine controller) |
| (SOC % graphically and numerically represented) | Battery State of Charge for >20-100% [80-100%(green); 21-79%(black)] show SOC %<br>Battery State of charge for ≤<br>[Discharged for >10% to ≤20% (red bar)] show "LOW" instead of SOC %<br>[Deeply Discharged ≤ 10% (red)] show "LOW" instead of SOC % | $SoC_{BATT}$ (stored in BLE) | $SoC_{BATT}$ |
| Charger Algo ID | Display value after "Charging Algorithm:" heading | | Directed Spatial to Charger 0x7F02C (Ref 8)<br>(stored in Charger) |
| Estimated Battery Maintenance % (if FLA Type) | This value will be given as a percentage, but displayed as a bar with 12 sections (2 red, 2 yellow and 8 green). | (stored in BLE) | |
| Last Battery Maintenance date (if FLA) | Value input by user inside of app and stored in CAN2BLE app | (stored in BLE) | |
| (Alerts Active graphically represented) | Display alert icon if lift device, charger, or battery monitoring system exists | | ES → PeCAN Byte (0x00F2 MS; 0x00F3, LS)<br>R → Pat???<br>Charger → Reported as DM1 from SA = 0x49 |

A SOC of battery 64 (e.g., $SoC_{BATT}$) can be displayed by controller 38 and user device 232 in two different ways. First, the SOC may be simply displayed (e.g., by utilizing a $SoC_{BATT}$ signal). Secondly, the SOC may be displayed in a time series bar chart. The time series bar chart may be populated by controller 38 utilizing the following information: $SoC_{BATT}$ at start of last charge cycle (transition to ChrgrState=1), $SoC_{BATT}$ at end of a last charge cycle (transition from ChrgrState=1), last reported $SoC_{BATT}$ value. A leftmost bar in the time series bar chart may represent $SoC_{BATT}$ at start of last charge cycle. Utilizing linear interpolation, bars may show increasing SOC in 5% increments until $SoC_{BATT}$ at an end of a last charge cycle is represented. A gap a width of one bar can be inserted as a transition. Then, using linear interpolation SoC can be shown in decreasing 5% increments until last reported $SoC_{BATT}$ is shown. Width of bars can be adjusted to fill chart width based on a number of bars being shown.

$SoC_{BATT}$ can also be displayed using a last five cycles time series chart. This chart may show charge and discharge over a previous five cycles. A y-axis of the chart is $SoC_{BATT}$. The chart may be continuous. Each state of charge inflection point may show a dot that is selectable by the user to display an exact value. An x-axis of the chart shows time (e.g., in relative time). Relative time means that the entire x-axis shows 100% of the total time summation from the charging and discharging from the last five cycles. The x-value for each dot may be reflective of the percentage of the whole. Machine discharge time may require a scaling factor of 2.3 in order to keep charge/discharge scaling properly. Controller 38 can store machine operating hours each time charger 65 status switches to ChrgrState=1. This value can be stored for the previous 5 charging cycles. This may enable this chart to show charge and discharge information for the last five cycles.

Controller 38 can also operate user device 232 to display a last water refill data and a progression bar. This information may only apply to flooded lead acid (FLA) batteries. If the controller 38 is not set to FLA battery type none of the calculations or values below may need determined or communicated. Last refill date can be generated by a user input inside of the mobile application and received through user device 232. When this is generated, the date may be stored in controller 38 until it is overwritten by a new date. This date can be displayed along with a progress bar going from 'Full' to 'Add Water'. This bar can be provided by the controller 38 as a percentage and then displayed in twelve increments based on a calculated percent water remaining. The increments can be: two red, two yellow and eight green.

Referring to FIGS. 4-7, 9-13, 15-16, 18-20, and 22-28, the mobile application may present a variety of GUIs to the user via user device 232. For example, GUI manager 228 may operate the user device 232 to provide a startup GUI 400, a terms and conditions GUI 500, a menu GUI 600, a fleet list or battery list GUI 700, a lift device or battery list GUI 900 of lift devices or batteries that require attention, a model selection GUI 1000, a model list GUI 1100, a connecting GUI 1200, a detailed GUI 1300, a prompt 1500, a detailed GUI 1600, a last five charge cycles GUI 1800, a proper charging practices GUI 1900, a detailed GUI 2000, a water level GUI 2200, a charge GUI 2300, a calendar GUI 2400, a refill reset date GUI 2500, a GUI 2600, an error GUI 2700, or a main menu GUI 2800 through the mobile application.

Figure 13:
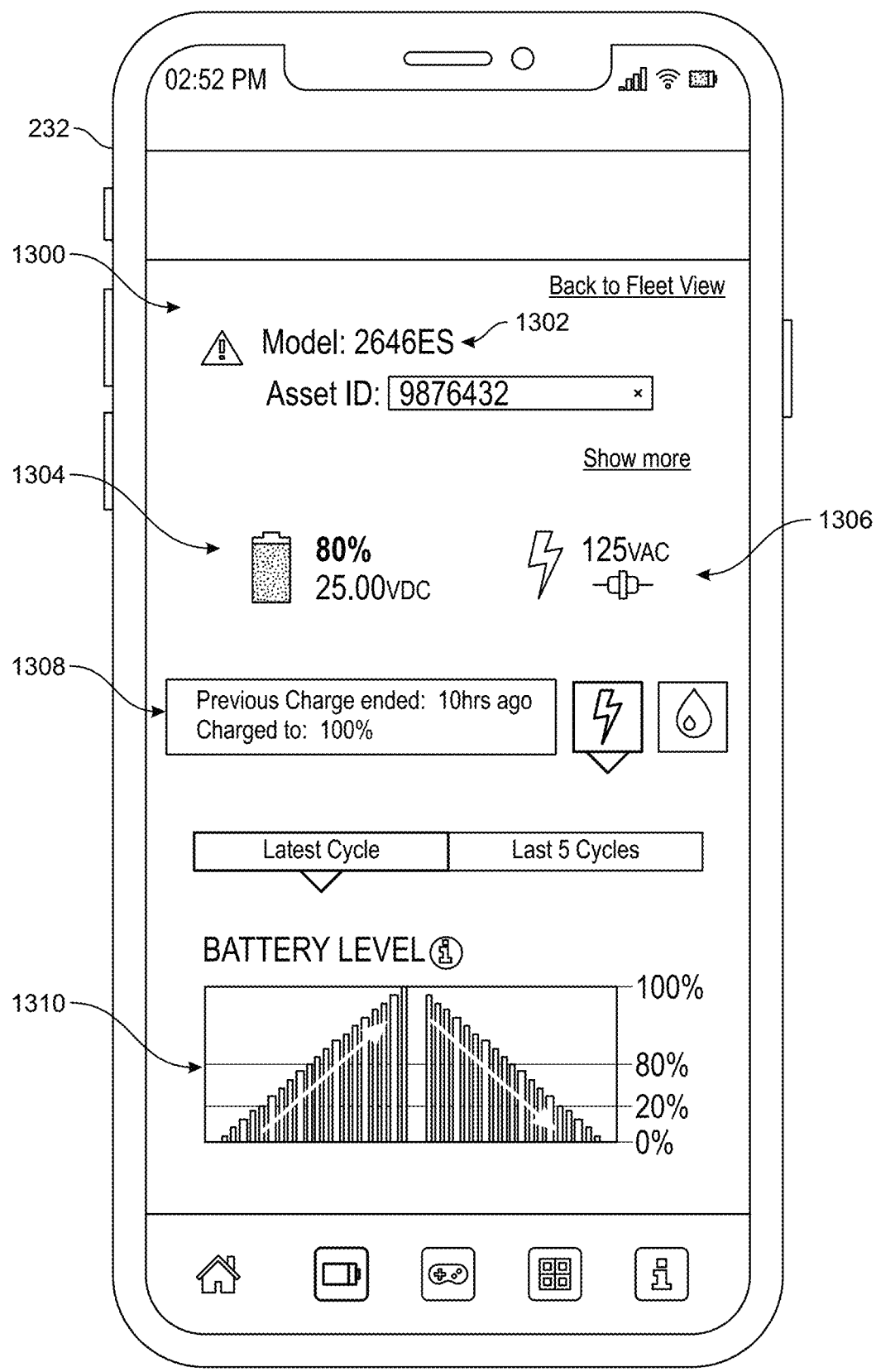
FIG. 13 is a diagram of the user device of the battery monitoring system of FIG. 2 displaying another GUI, according to an exemplary embodiment.

Referring particularly to FIG. 13, detailed GUI 1300 can provide a model ID 1302, an asset ID, a battery level icon 1304 that indicates a battery level of battery 64, a charging status icon 1306, a previous charge notification 1308, and a battery level graph 1310.

Figure 8:
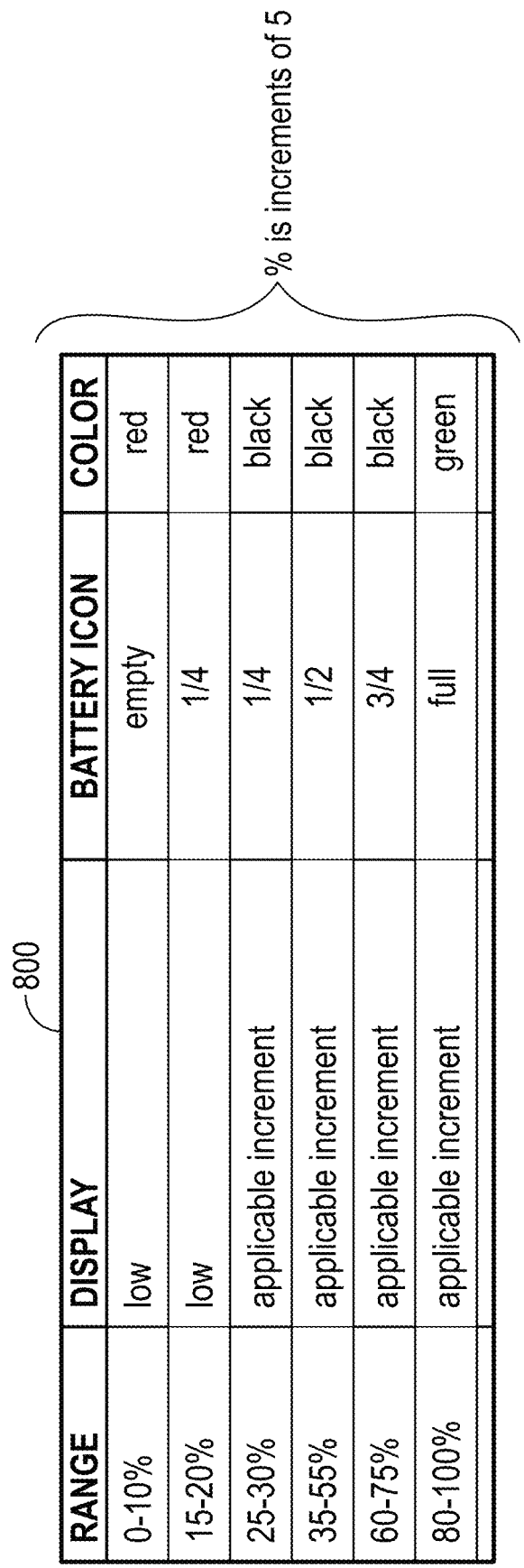
FIG. 8 is a table of different icons that can be displayed on a GUI, according to an exemplary embodiment.
Figure 9:
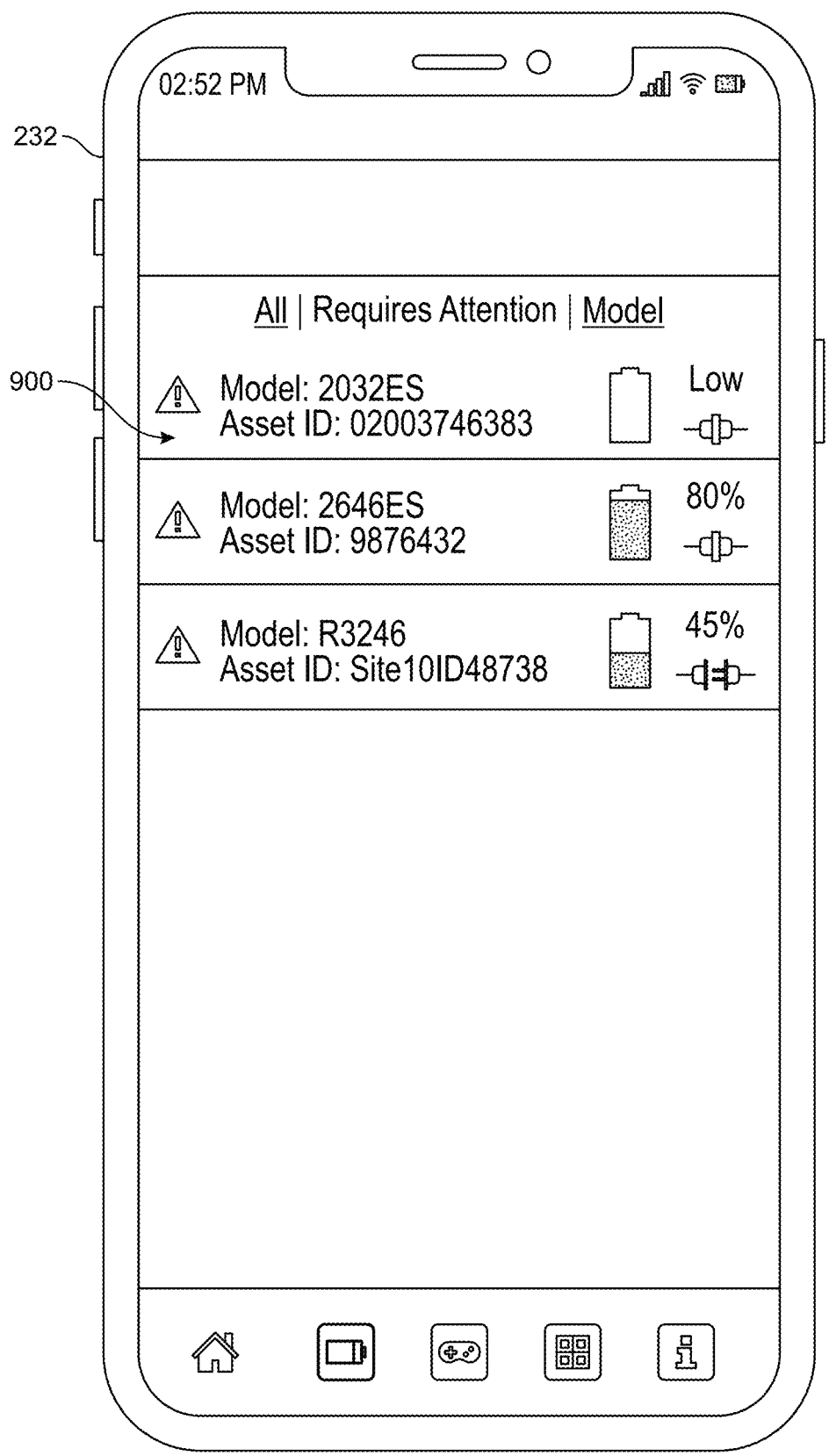
FIG. 9 is a diagram of the user device of the battery monitoring system of FIG. 2 displaying another GUI, according to an exemplary embodiment.
Figure 10:
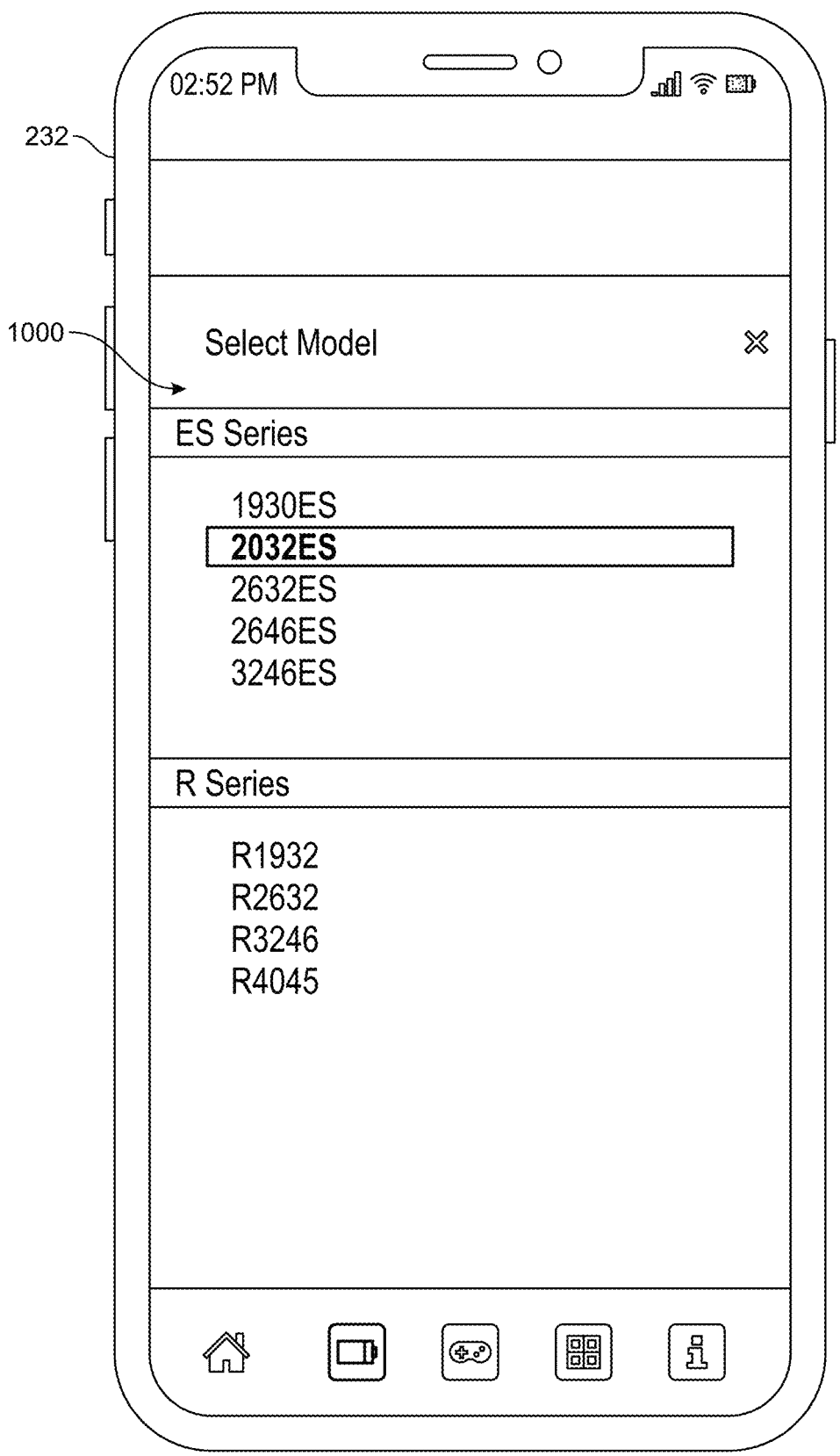
FIG. 10 is a diagram of the user device of the battery monitoring system of FIG. 2 displaying another GUI, according to an exemplary embodiment.
Figure 11:
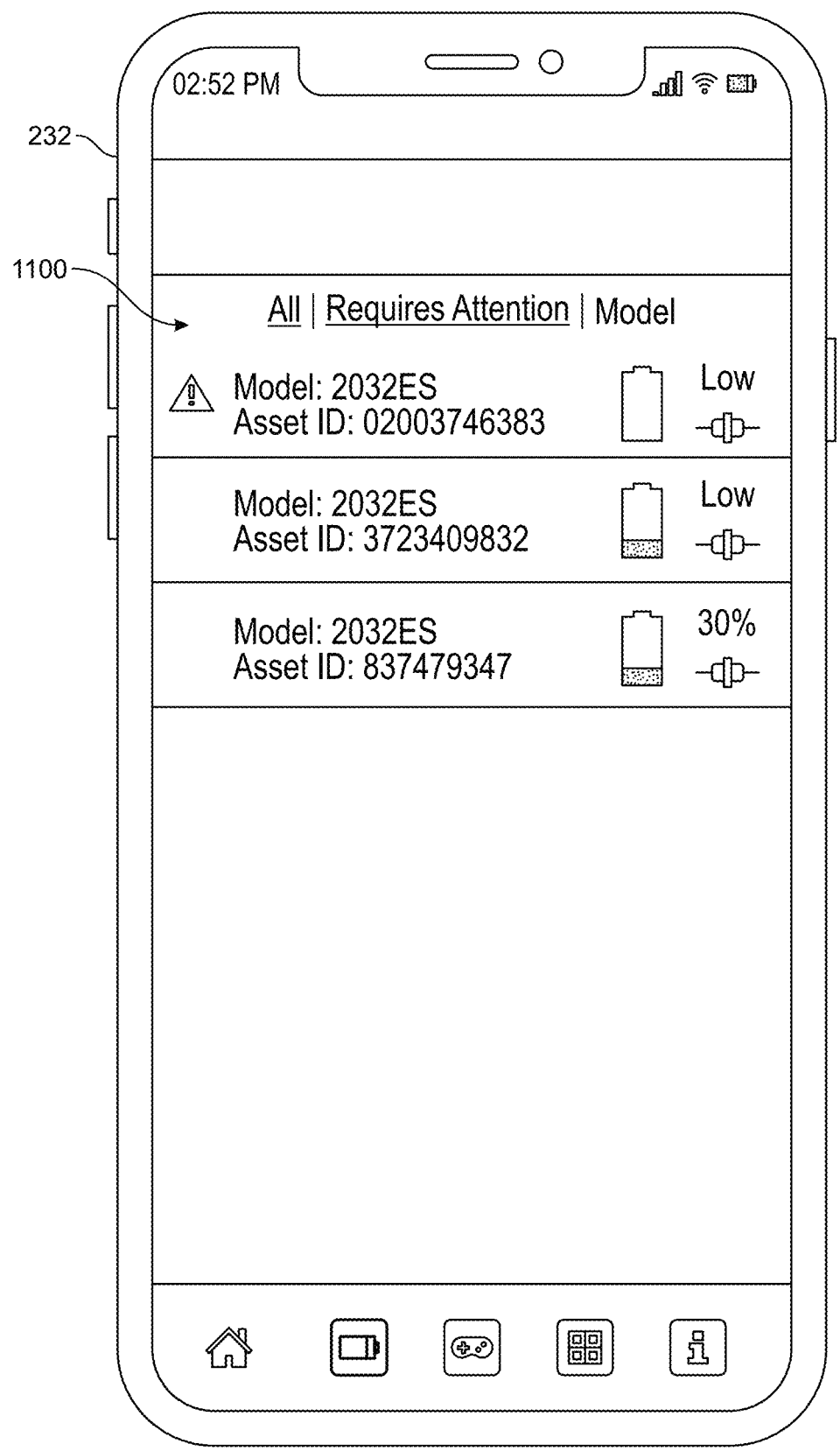
FIG. 11 is a diagram of the user device of the battery monitoring system of FIG. 2 displaying another GUI, according to an exemplary embodiment.
Figure 12:
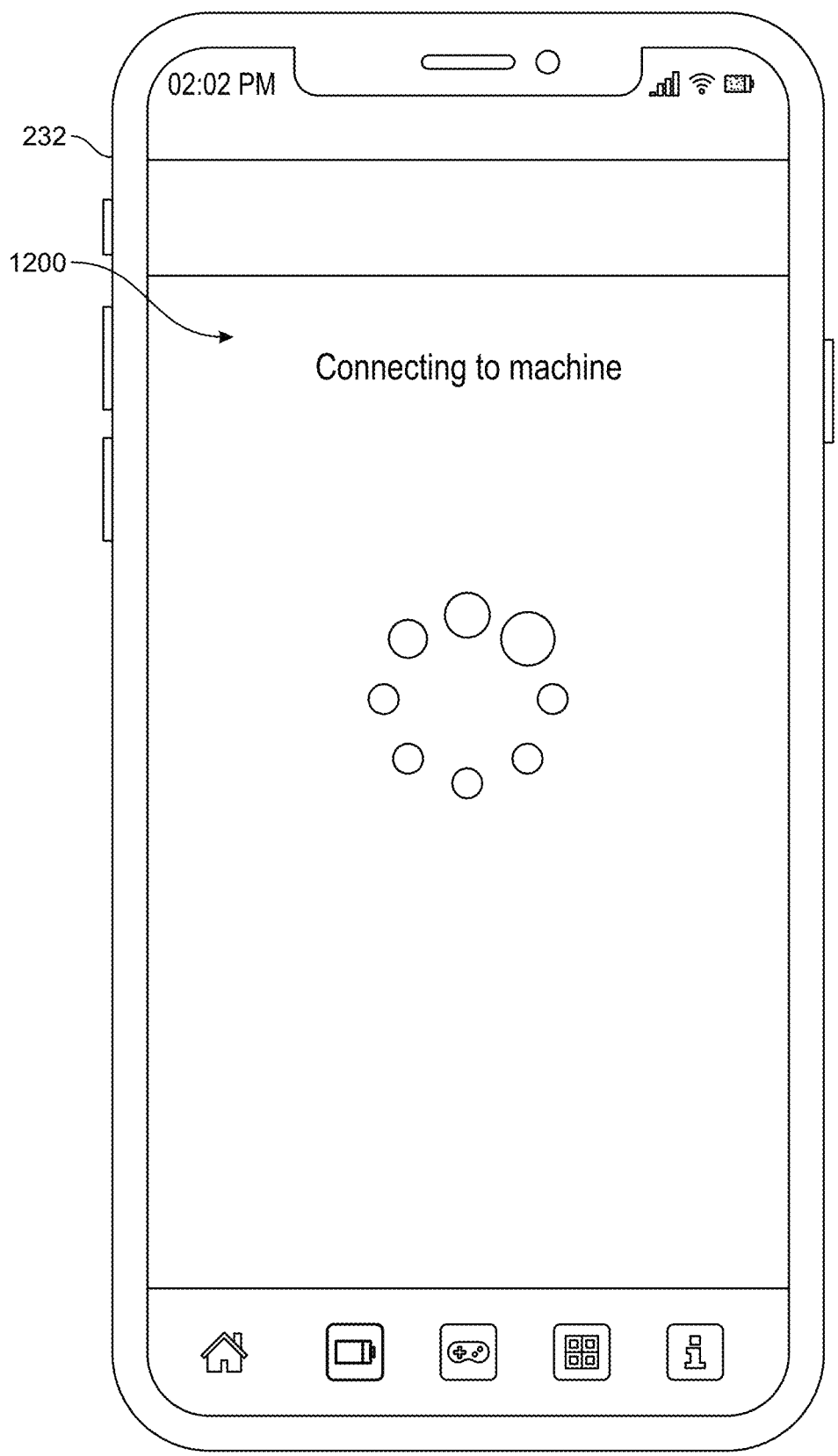
FIG. 12 is a diagram of the user device of the battery monitoring system of FIG. 2 displaying another GUI, according to an exemplary embodiment.

Referring particularly to FIG. 8, table 800 demonstrates different icon colors or icon properties that can be displayed via user device 232 based on a current battery level. For example, if the current battery level is 0-10%, the icon may be an empty battery icon with a red color and display a "low" message. Likewise, if the current battery level is 15-20%, the icon may be a ¼ full battery icon that is displayed in a red color. The battery icon may be displayed as empty, ¼ full, half full, ¾ full, or full based on the current battery level. The color of the battery icon may be red, black, or green based on the current battery level.

Figure 14:
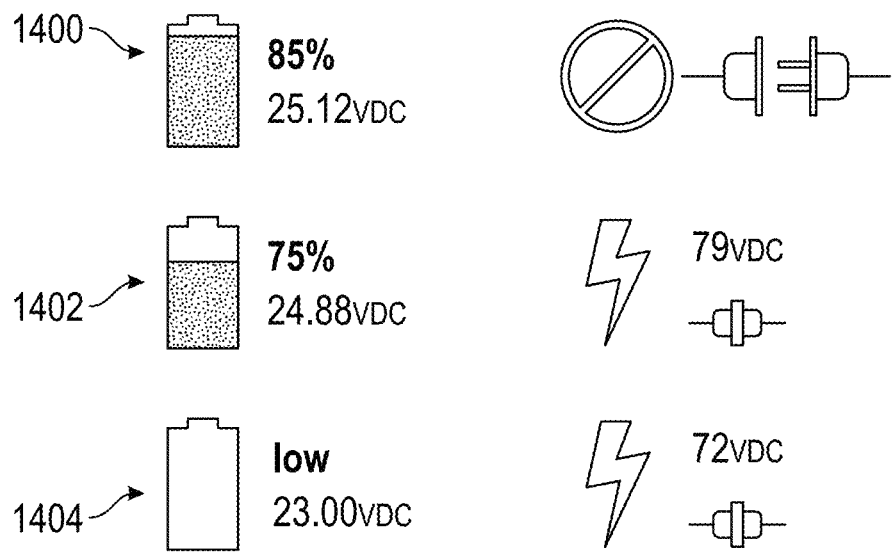
FIG. 14 is a diagram of various icons that can be displayed on a GUI, according to an exemplary embodiment.
Figure 15:
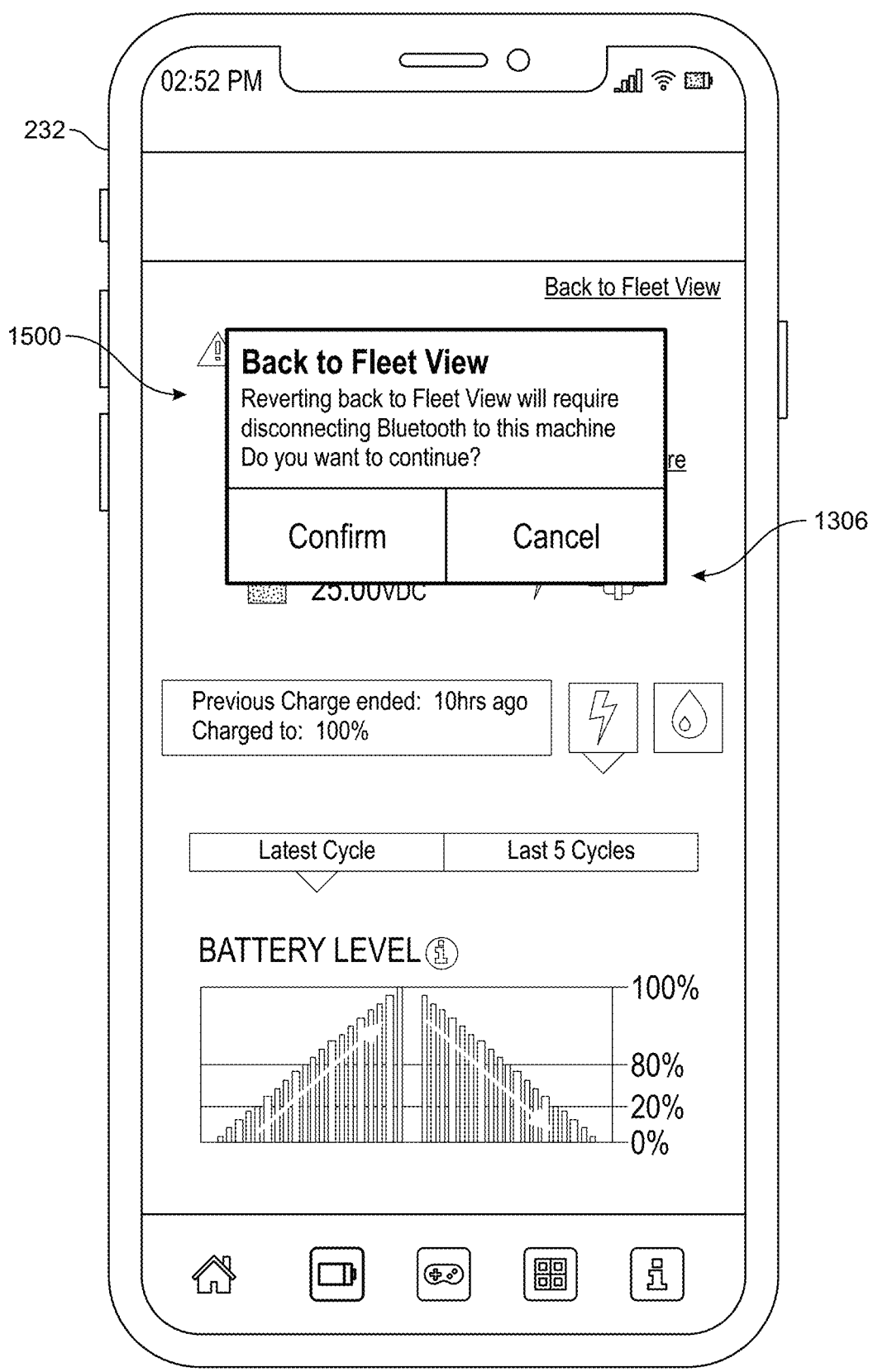
FIG. 15 is a diagram of the user device of the battery monitoring system of FIG. 2 displaying another GUI, according to an exemplary embodiment.
Figure 16:
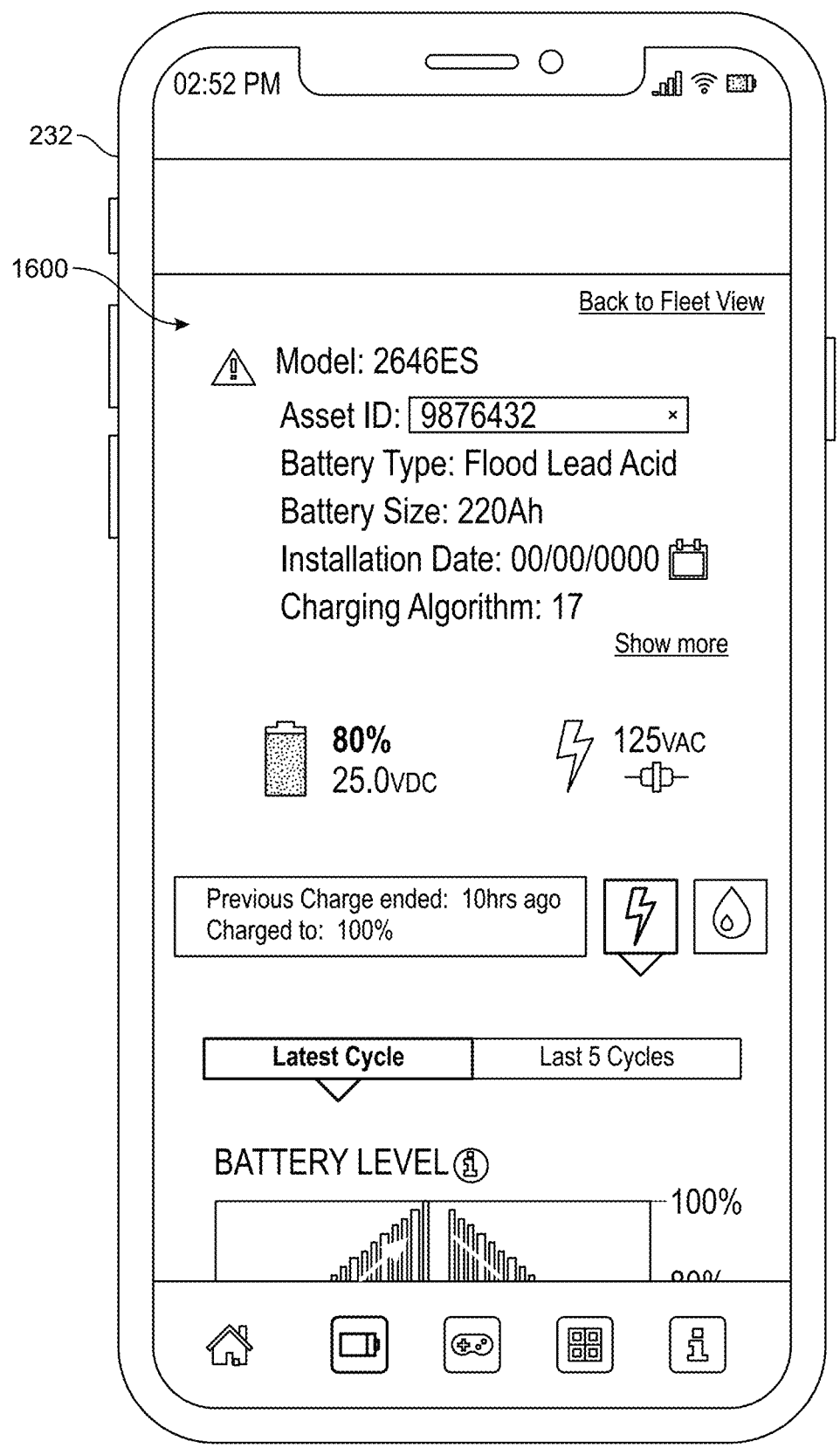
FIG. 16 is a diagram of the user device of the battery monitoring system of FIG. 2 displaying another GUI, according to an exemplary embodiment.
Figure 17:
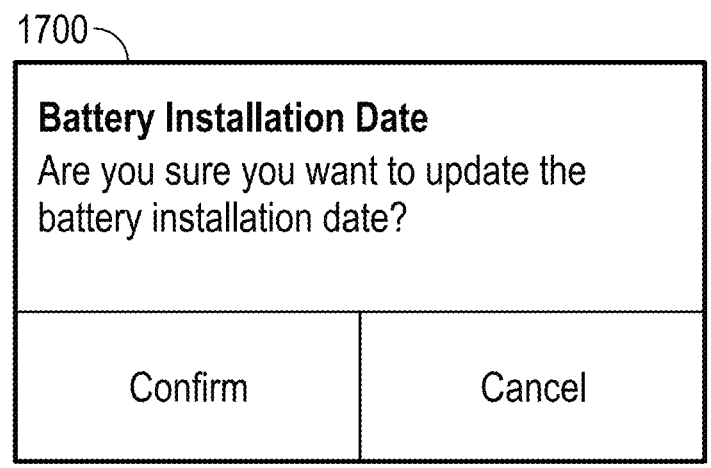
FIG. 17 is a diagram of a prompt dialog for a user to confirm update of a battery installation date, according to an exemplary embodiment.
Figure 18:
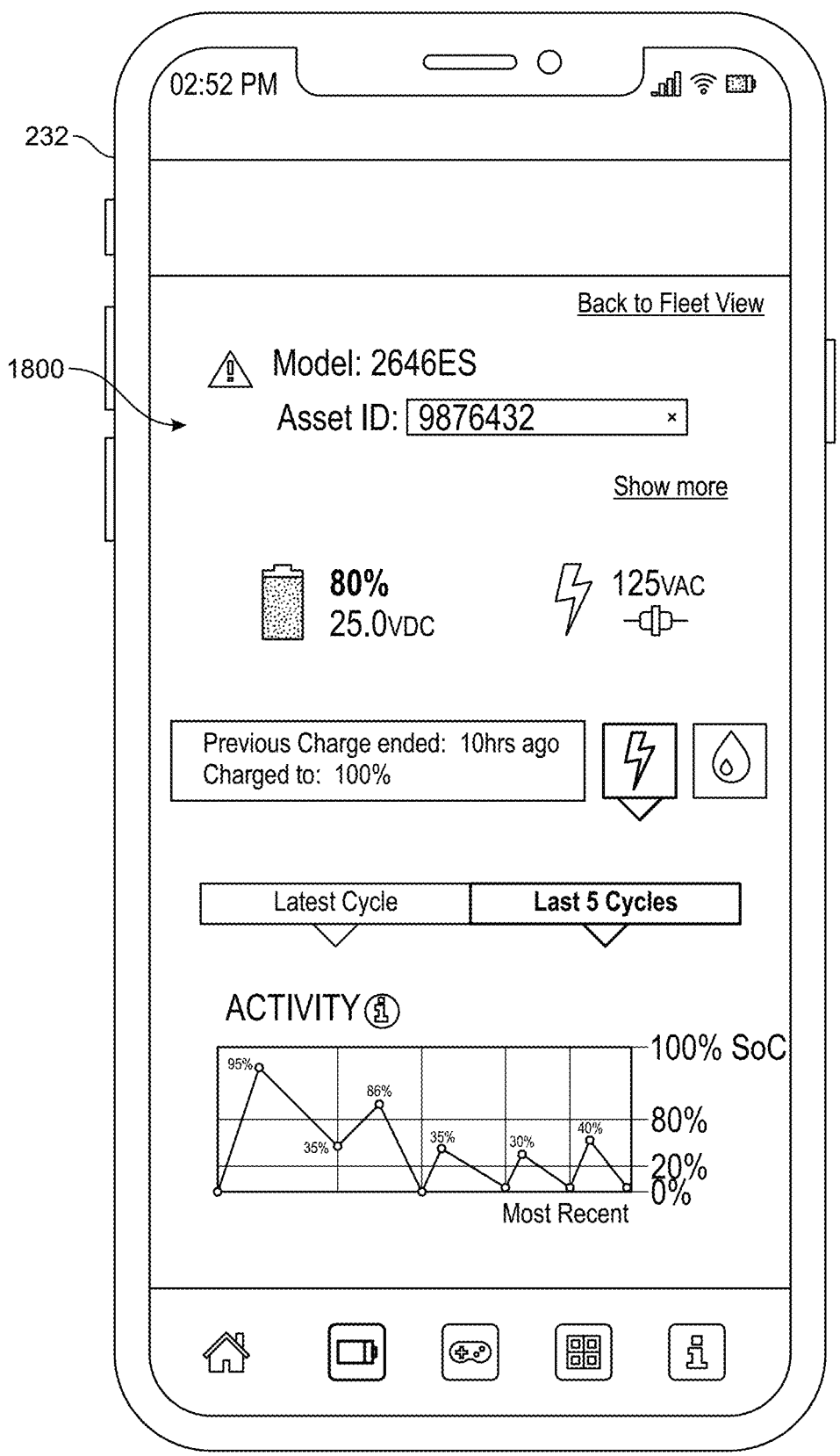
FIG. 18 is a diagram of the user device of the battery monitoring system of FIG. 2 displaying another GUI, according to an exemplary embodiment.
Figure 19:
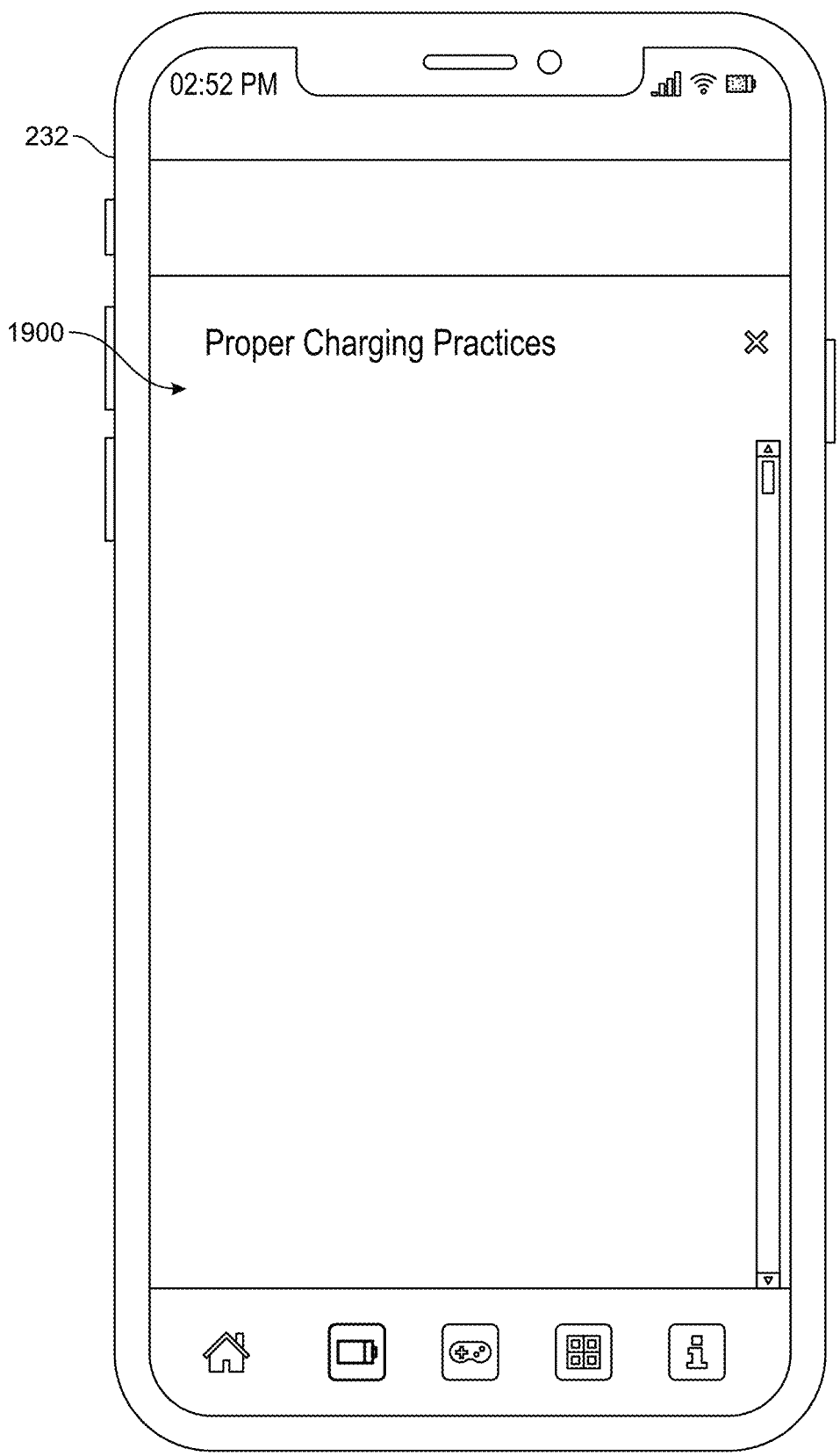
FIG. 19 is a diagram of the user device of the battery monitoring system of FIG. 2 displaying another GUI, according to an exemplary embodiment.
Figure 20:
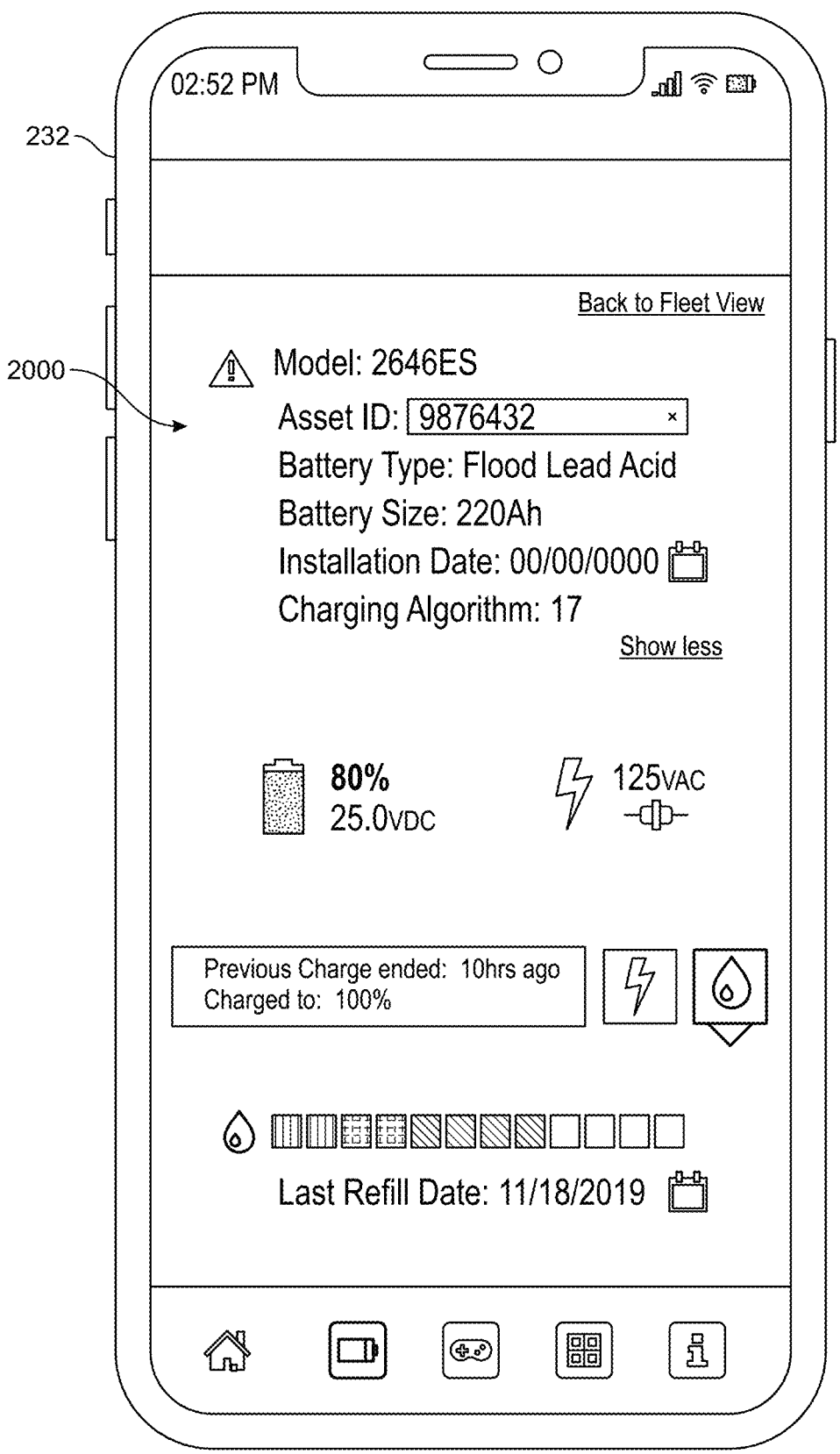
FIG. 20 is a diagram of the user device of the battery monitoring system of FIG. 2 displaying another GUI, according to an exemplary embodiment.
Figure 21:
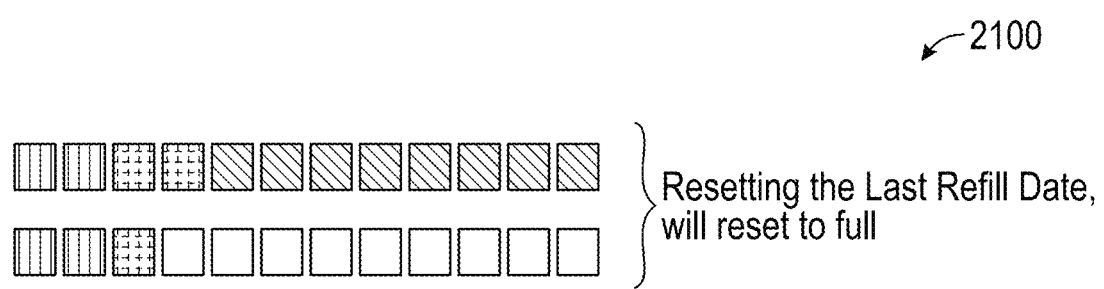
FIG. 21 is a diagram of a battery indicator that can be displayed on a GUI, according to an exemplary embodiment.
Figure 22:
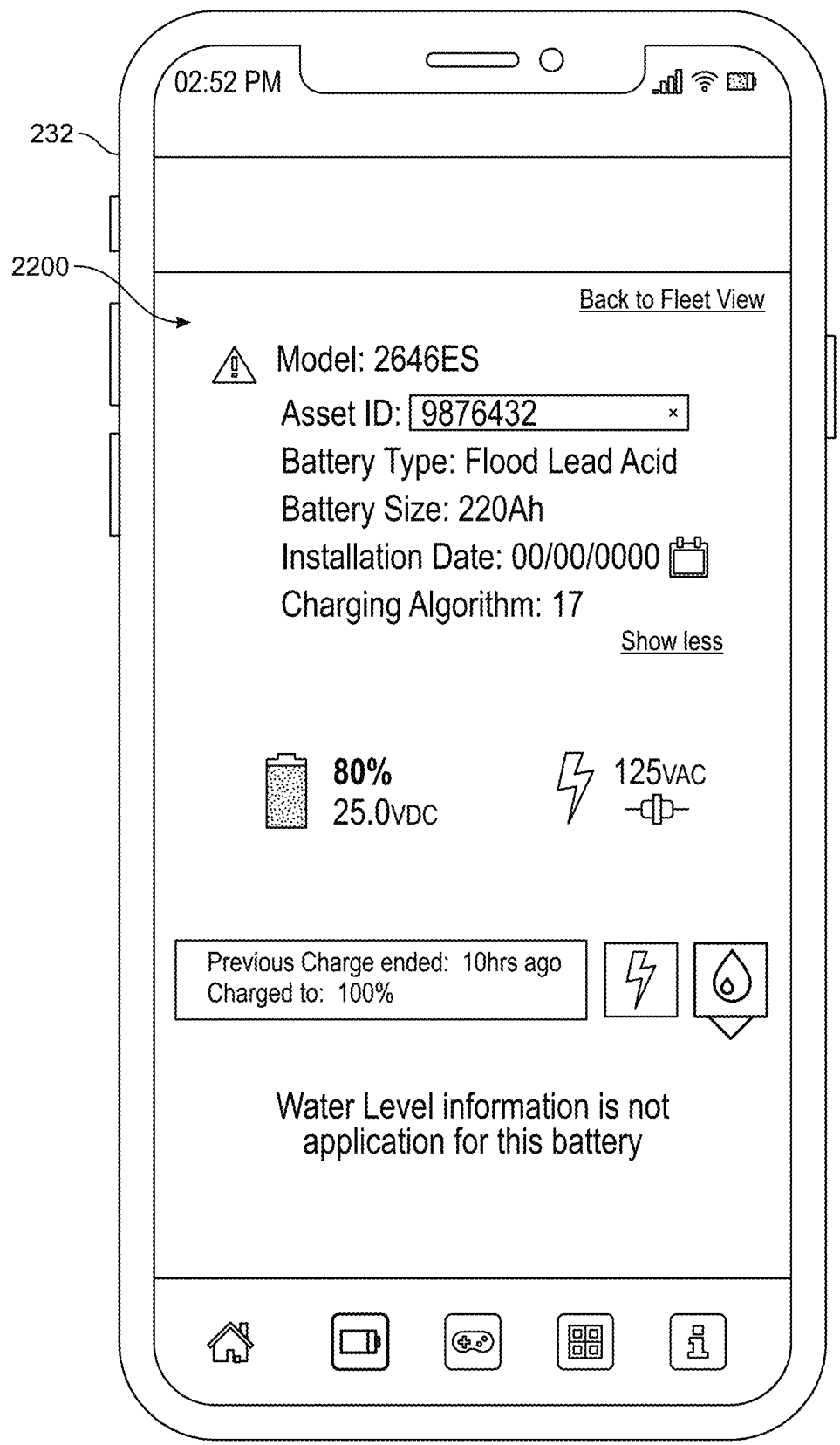
FIG. 22 is a diagram of the user device of the battery monitoring system of FIG. 2 displaying another GUI, according to an exemplary embodiment.
Figure 23:
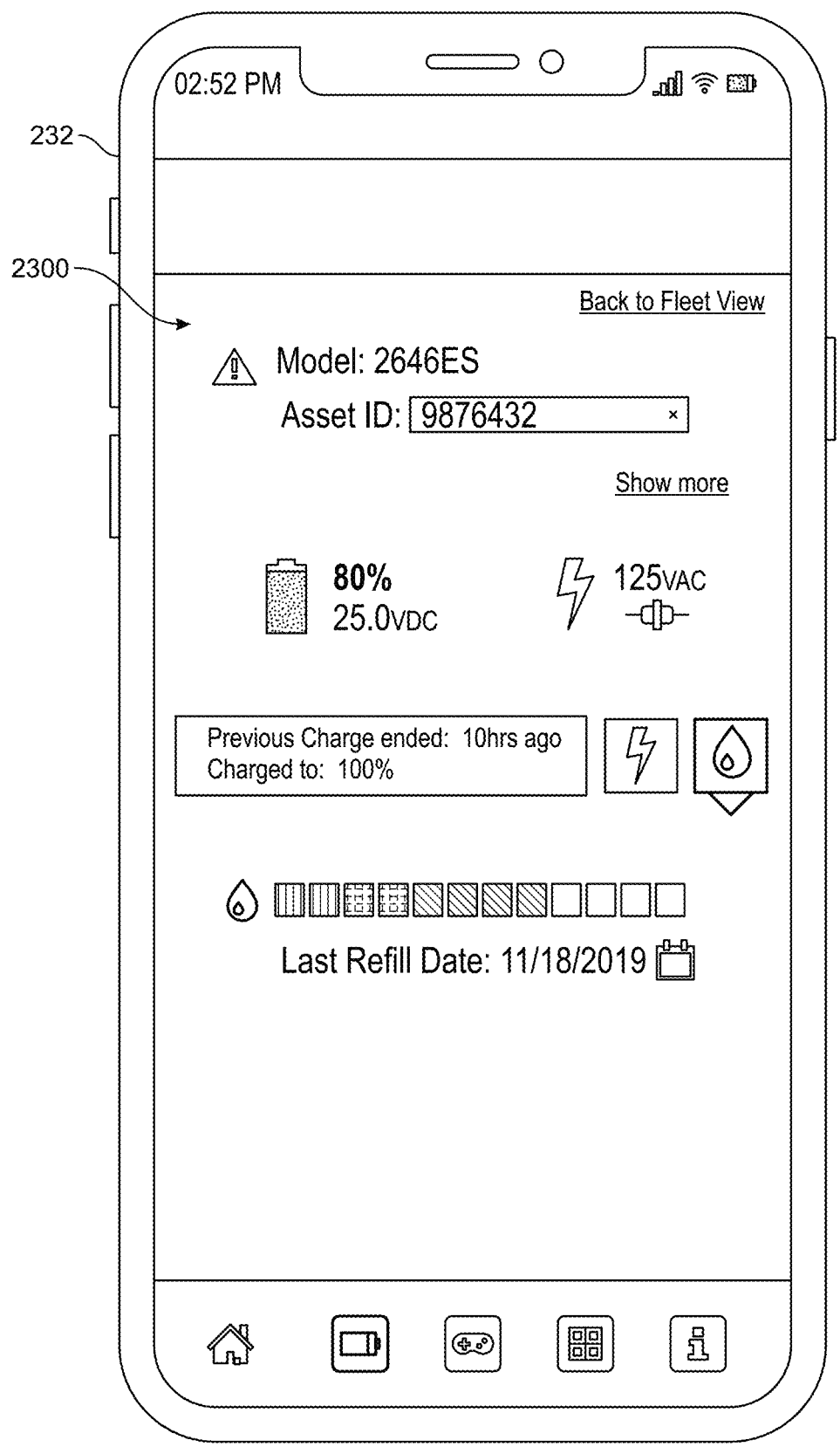
FIG. 23 is a diagram of the user device of the battery monitoring system of FIG. 2 displaying another GUI, according to an exemplary embodiment.
Figure 24:
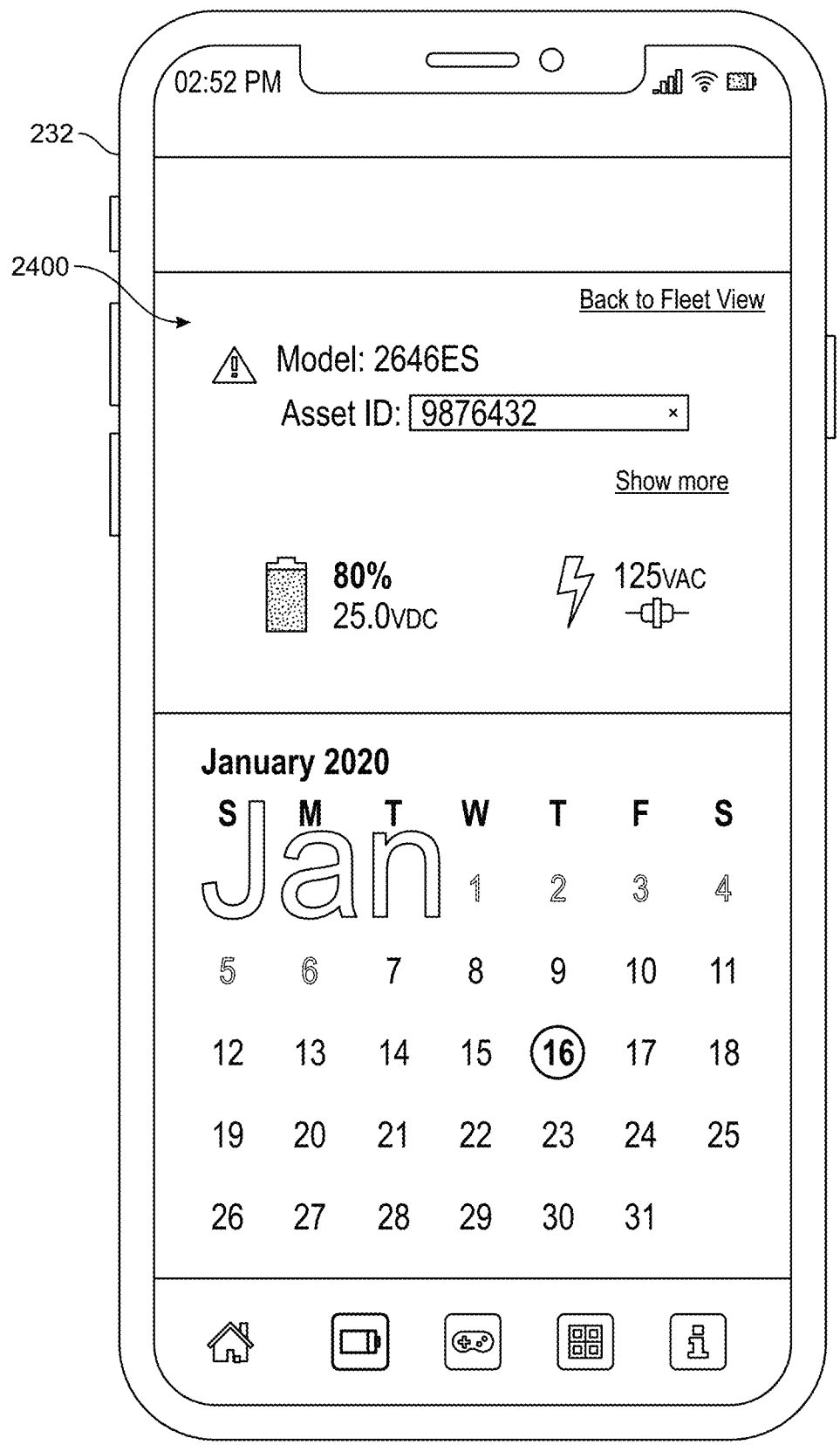
FIG. 24 is a diagram of the user device of the battery monitoring system of FIG. 2 displaying another GUI, according to an exemplary embodiment.
Figure 25:
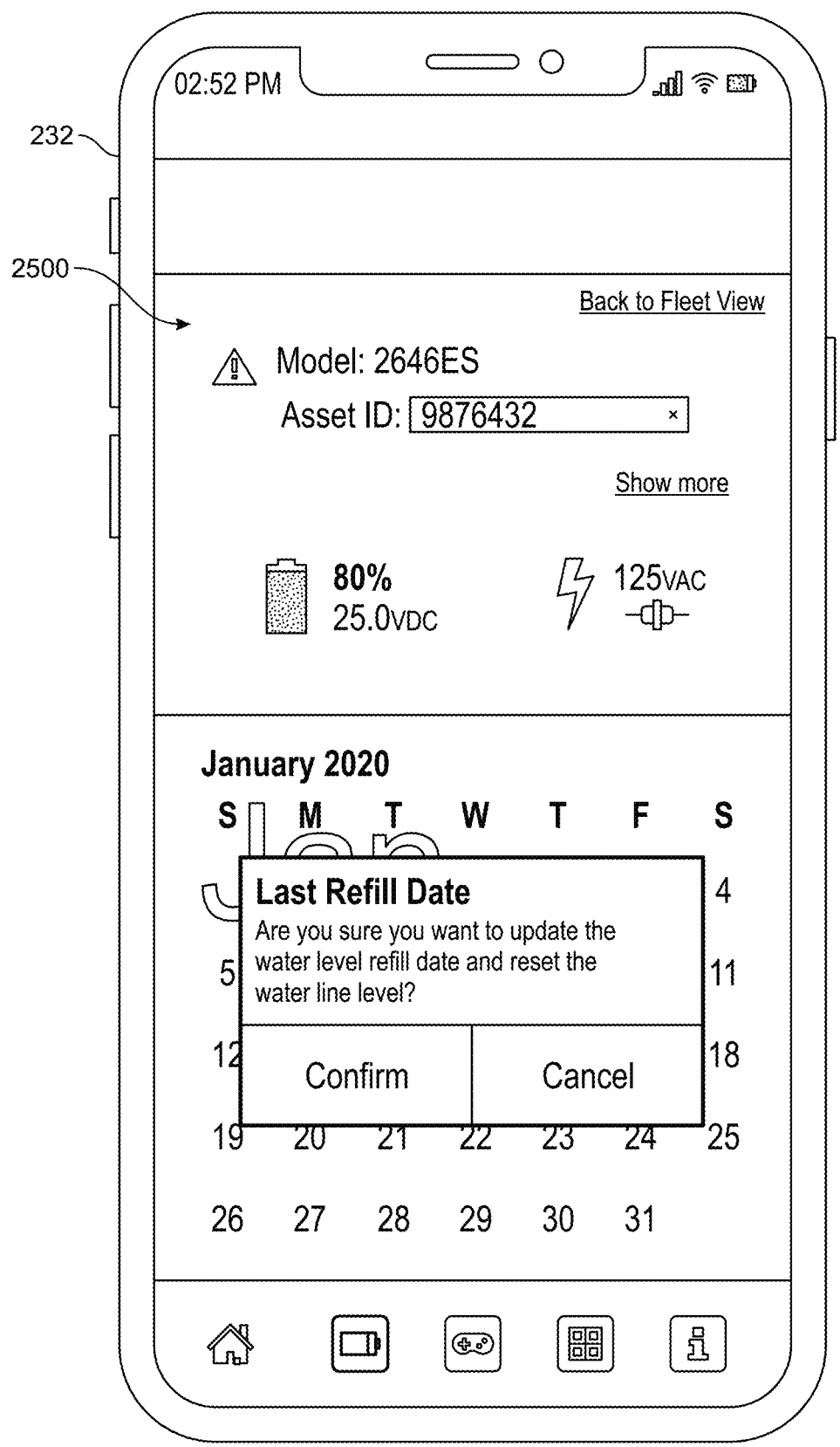
FIG. 25 is a diagram of the user device of the battery monitoring system of FIG. 2 displaying another GUI, according to an exemplary embodiment.
Figure 26:
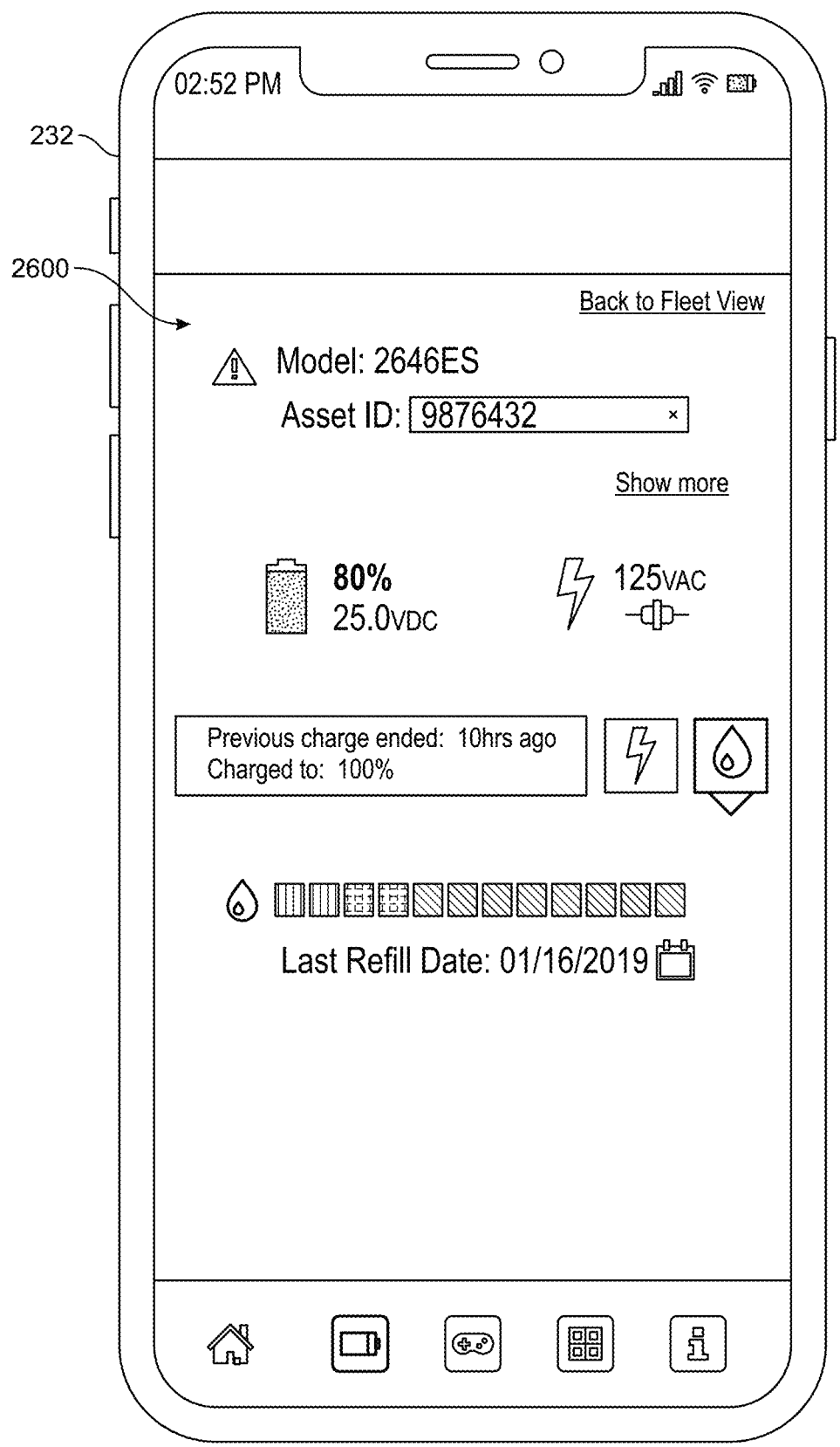
FIG. 26 is a diagram of the user device of the battery monitoring system of FIG. 2 displaying another GUI, according to an exemplary embodiment.
Figure 27:
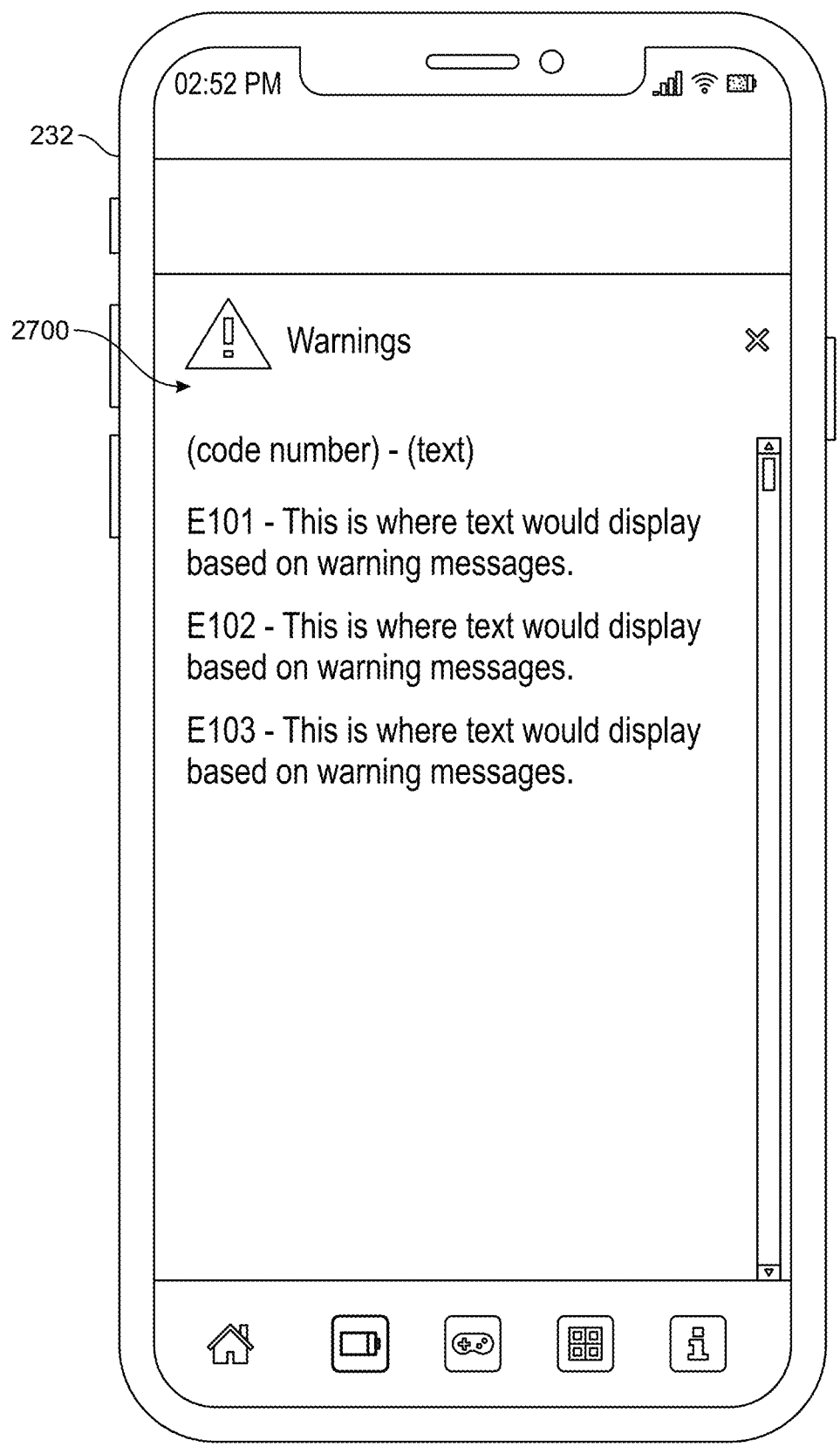
FIG. 27 is a diagram of the user device of the battery monitoring system of FIG. 2 displaying another GUI, according to an exemplary embodiment.
Figure 28:
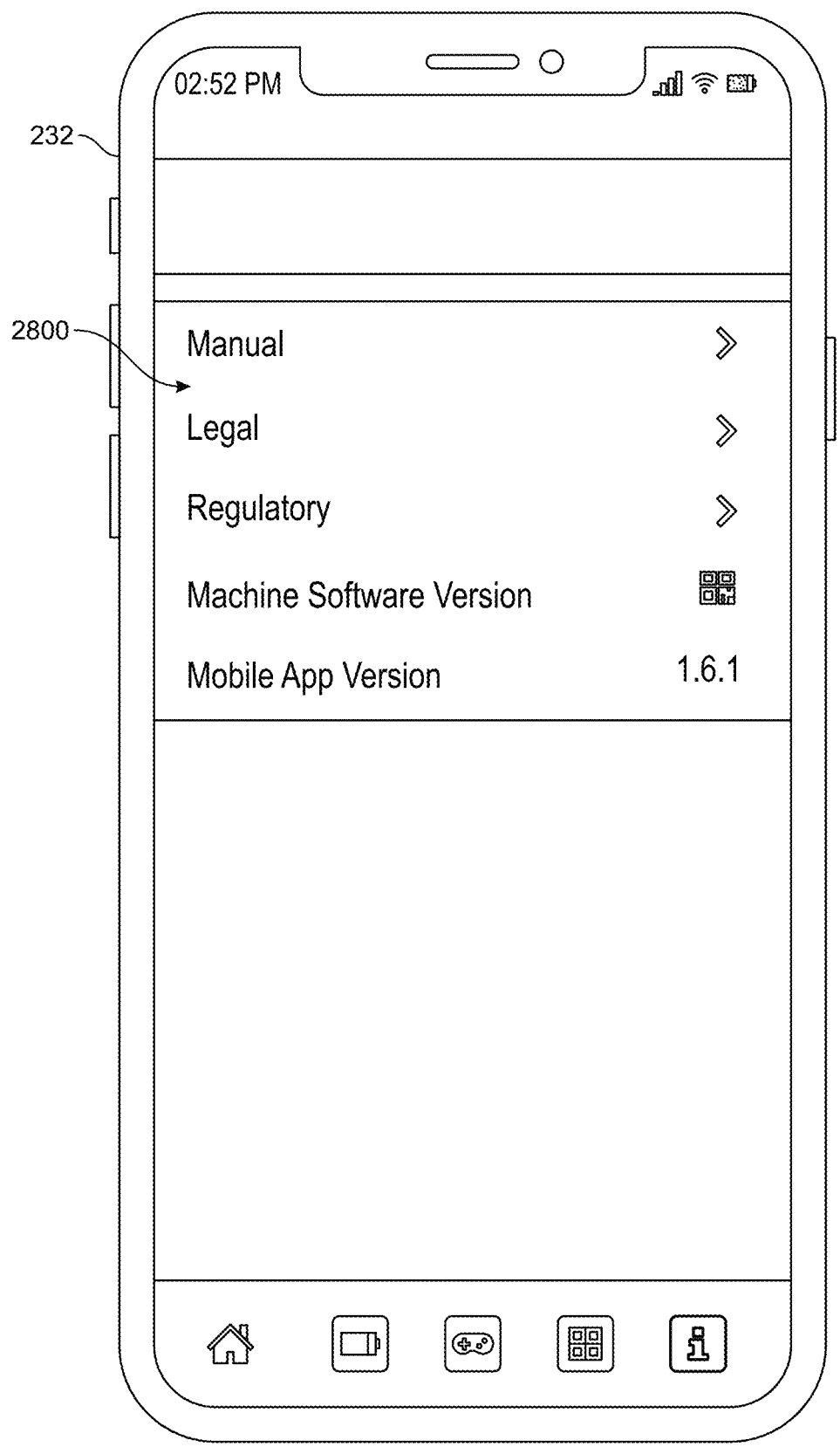
FIG. 28 is a diagram of the user device of the battery monitoring system of FIG. 2 displaying another GUI, according to an exemplary embodiment.

Referring particularly to FIG. 14, user device 232 can provide a first battery icon 1400, a second battery icon 1402, or a third battery icon 1404 based on the current battery level of battery 64. Referring particularly to FIG. 17, the user device 232 can provide a prompt to the user to confirm that the user desires to update a battery installation date. Referring particularly to FIG. 21, the user device 232 can also display a bar chart 2100 indicating an amount of remaining water or electrolyte in the battery 64. Resetting the last refill date may reset bar chart 2100 to full. Bar chart 2100 may include red, yellow, and green icons, which may change to a different color (e.g., gray) as the amount of water or electrolyte in battery 64 changes.

State of Charge Process

Figure 3:
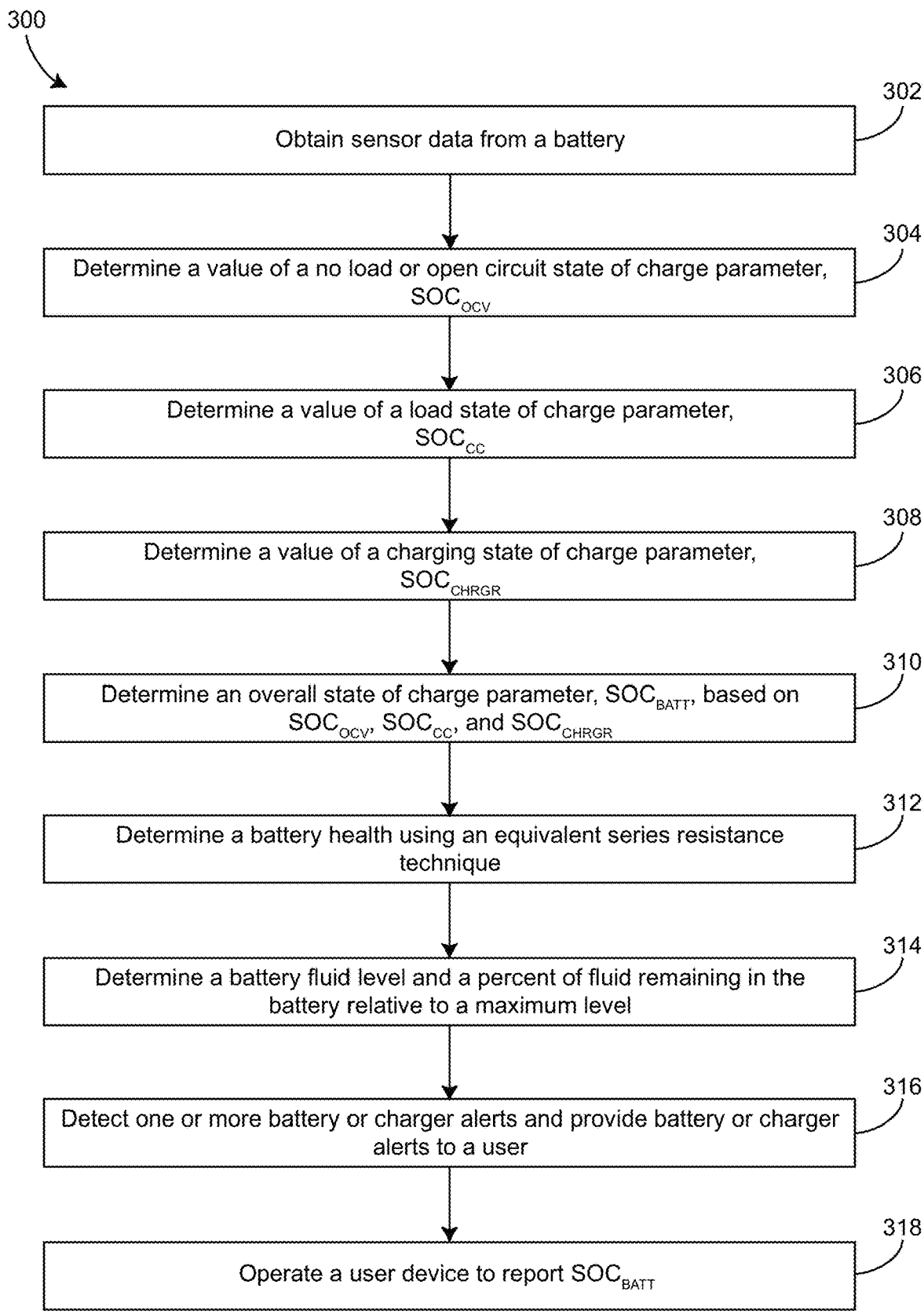
FIG. 3 is a flow diagram of a process for calculating a state of charge of a battery, according to an exemplary embodiment.
Figure 4:
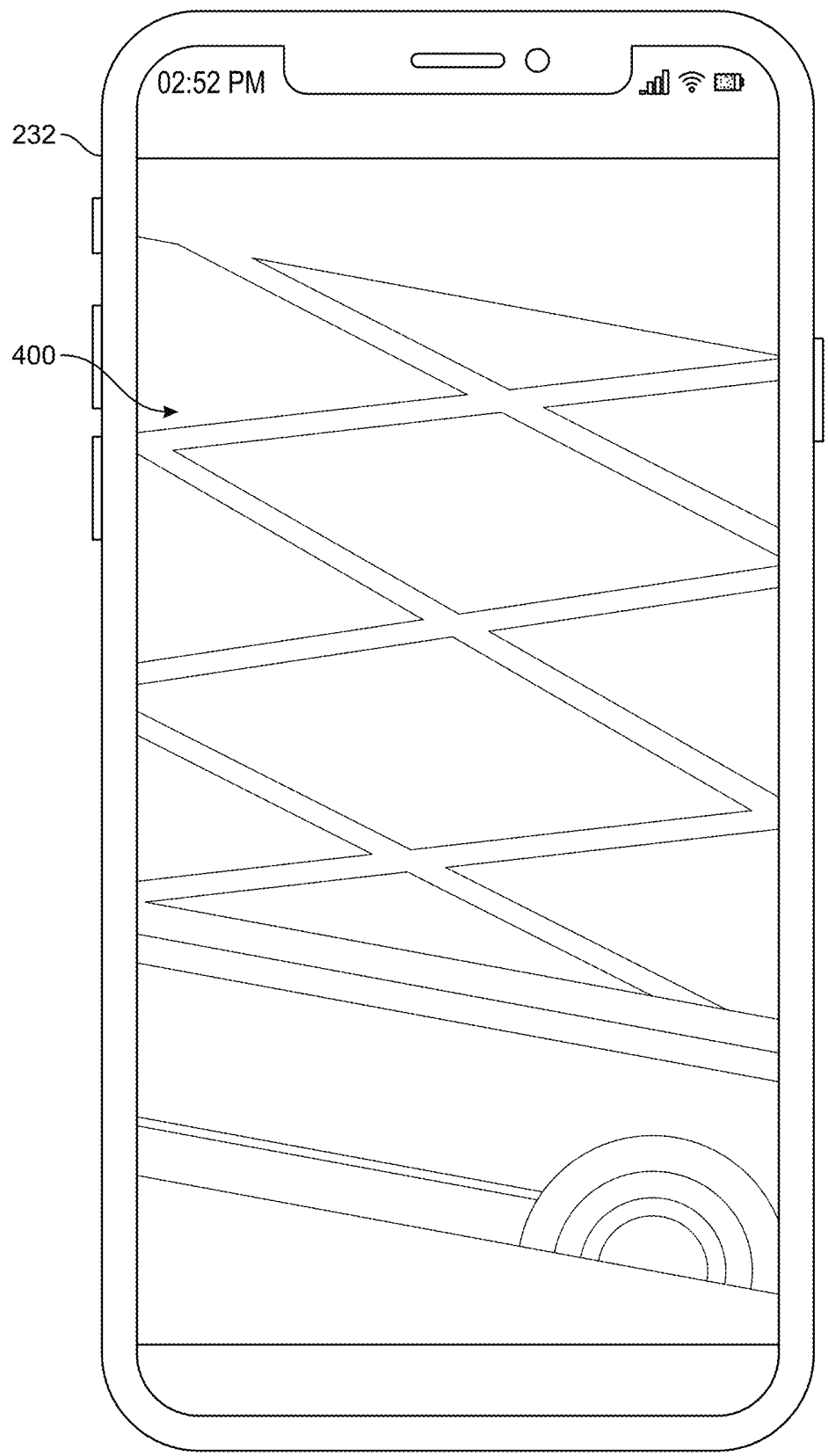
FIG. 4 is a diagram of a user device of the battery monitoring system of FIG. 2 displaying a first graphical user interface (GUI), according to an exemplary embodiment.
Figure 5:
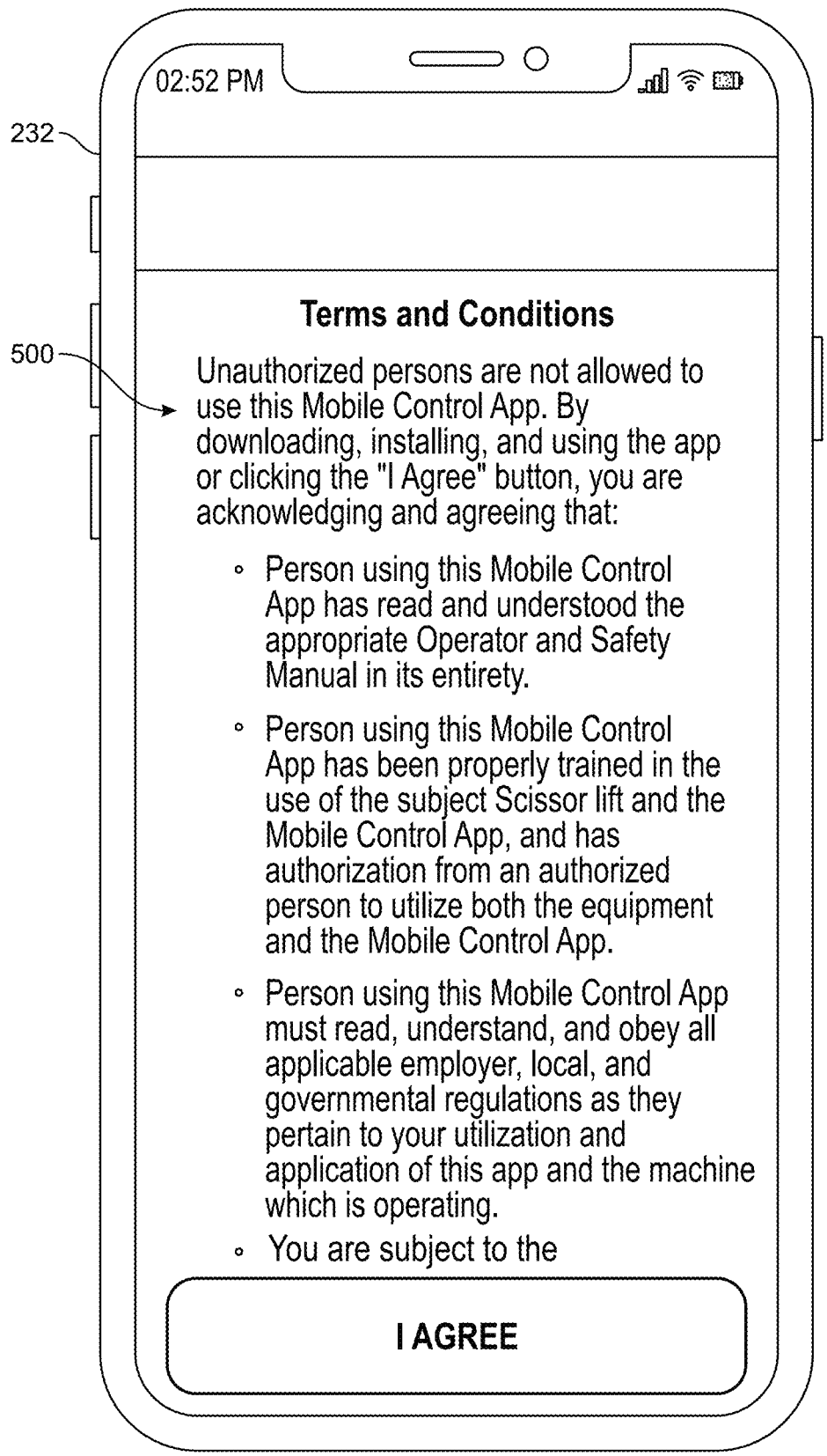
FIG. 5 is a diagram of the user device of the battery monitoring system of FIG. 2 displaying another GUI, according to an exemplary embodiment.
Figure 6:
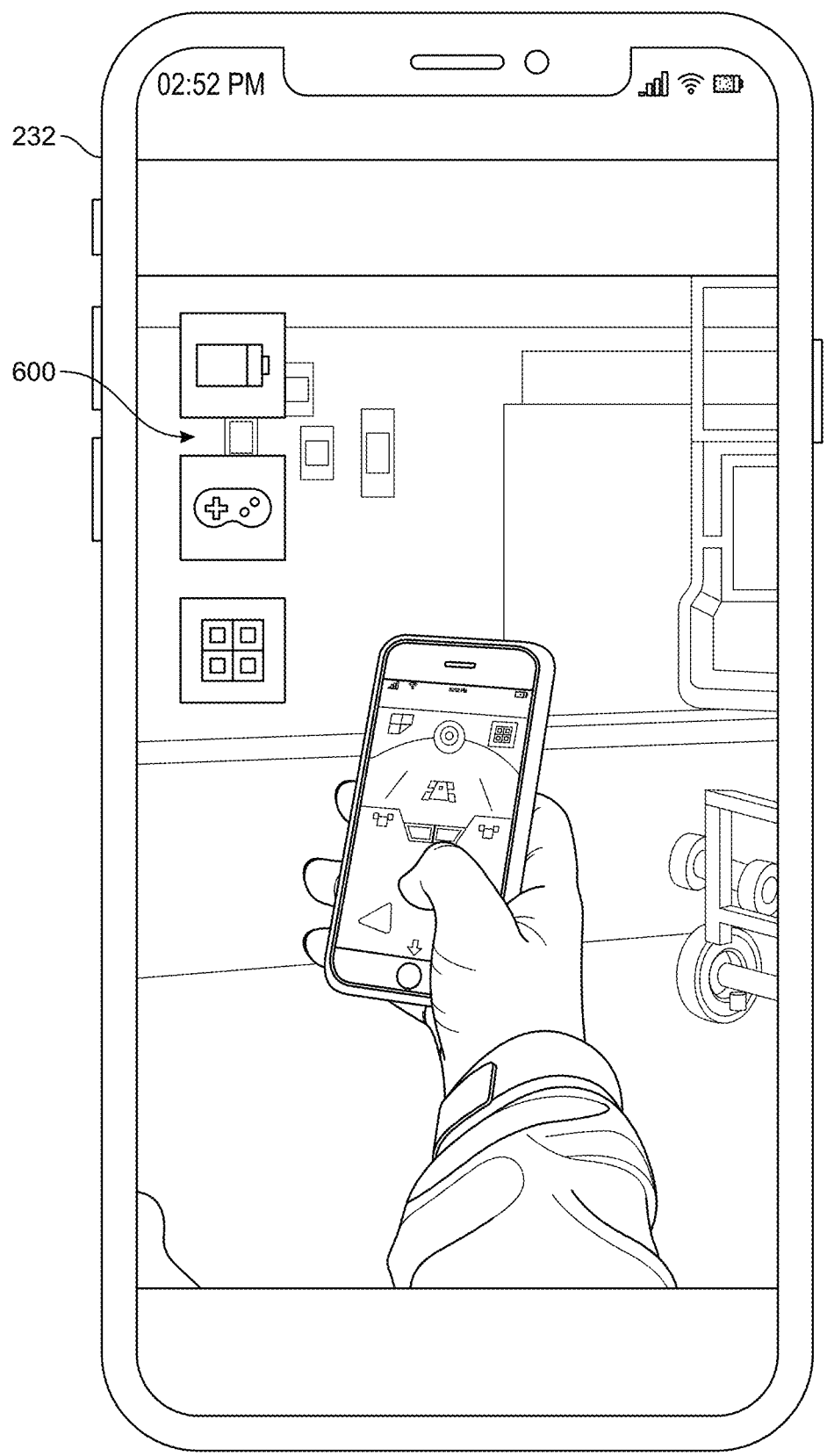
FIG. 6 is a diagram of the user device of the battery monitoring system of FIG. 2 displaying another GUI, according to an exemplary embodiment.
Figure 7:
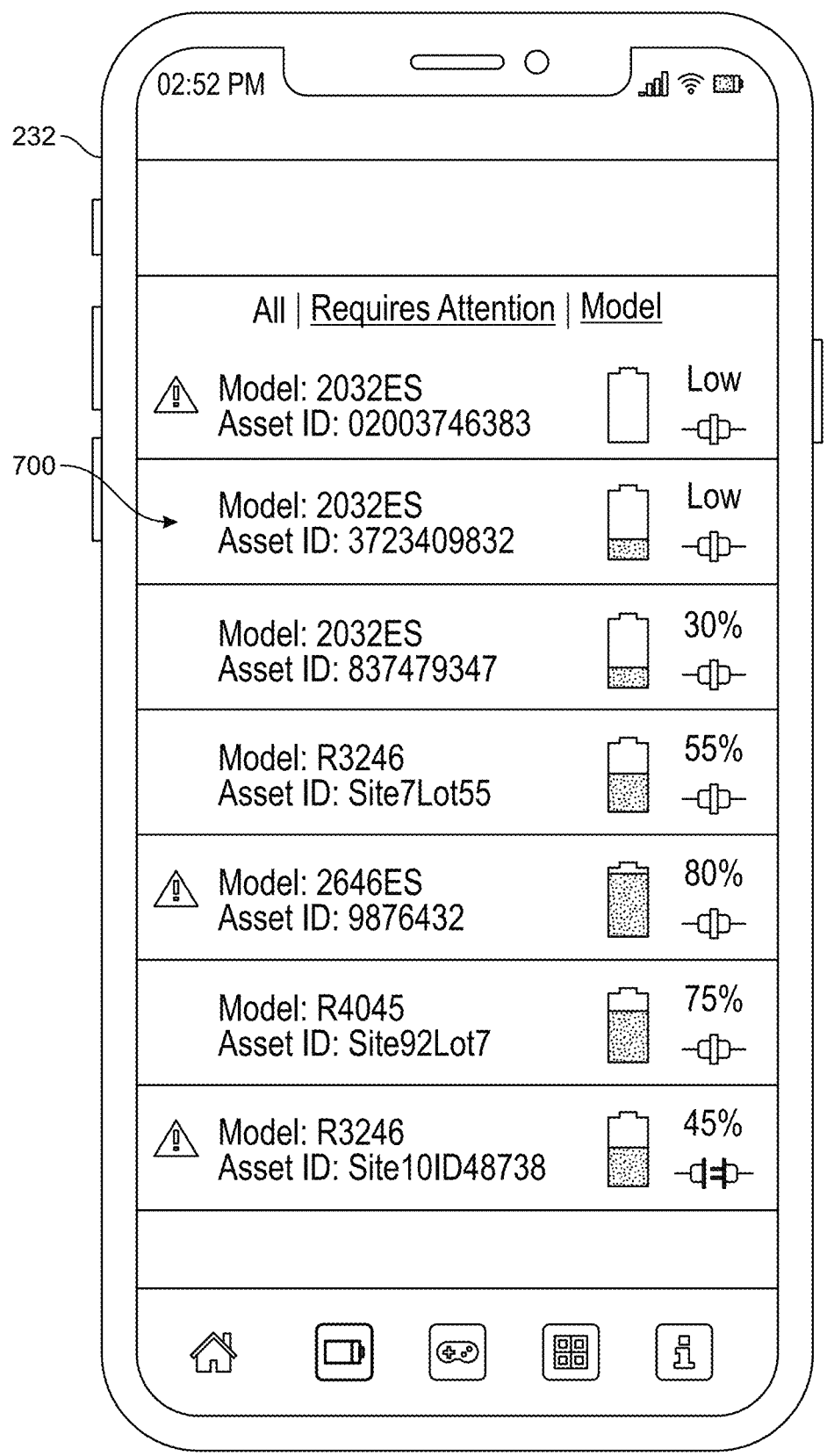
FIG. 7 is a diagram of the user device of the battery monitoring system of FIG. 2 displaying another GUI, according to an exemplary embodiment.

Referring particularly to FIG. 3, a process 300 for determining an SOC of a battery is shown, according to an exemplary embodiment. Process 300 includes steps 302-318 and can be performed by controller 38 to determine a SOC of battery 64.

Process 300 includes obtaining sensor data from a battery (and/or from a charger) (step 302), according to some embodiments. Step 302 may be performed by controller 38, or more particularly, by sensor manager 218 using any of the techniques described in greater detail above with reference to FIG. 2. Step 302 can include obtaining sensor data (e.g., voltage, current, temperature, etc.) of battery 64 from battery sensor 214 and/or battery sensor 216. In some embodiments, the sensor data or battery data is obtained through CAN 219.

Process 300 includes determining a value of a no load or open circuit state of charge parameter, $SoC_{OCV}$ (step 304), according to some embodiments. Step 304 can be performed by no load assessment manager 208 by performing the techniques or functionality as described in greater detail above with reference to FIG. 2. The no load assessment may be performed to determine SOC of the battery when the battery is not under load.

Process 300 includes determining a value of a load state of charge parameter, $SoC_{CC}$ (step 306), according to some embodiments. Step 306 can be performed by discharge assessment manager 210 using any of the techniques or functionality described in greater detail above with reference to FIG. 2. Step 306 can include using a Coulomb counting technique to determine the value of the parameter $SoC_{CC}$. The parameter $SoC_{CC}$ may indicate an estimated SOC of battery 64 when battery 64 is under a working load (e.g., to drive or operate lift device 10).

Process 300 includes determining a value of a charging state of charge parameter $SoC_{CHRGR}$ (step 308), according to some embodiments. Step 308 can be performed by charger assessment manager 212 using any of the techniques described in greater detail above with reference to FIG. 2.

The parameter $SoC_{CHRGR}$ may be an estimated or calculated SOC when battery 64 is being charged (e.g., by a charger).

Process 300 includes determining an overall state of charge parameter of the battery, $SoC_{BATT}$, based on $SoC_{OCV}$, $SoC_{CC}$, and $SoC_{CHRGR}$ (step 310), according to some embodiments. In some embodiments, the parameter $SoC_{BATT}$ is a weighted average of $SoC_{OCV}$, $SoC_{CC}$, and $SoC_{CHRGR}$. The parameter $SoC_{BATT}$ can be clipped so that the parameter does not increase by more than 5% between subsequent calculations or estimations. Step 310 can be performed by battery SOC manager 220 using any of the techniques described in greater detail above with reference to FIG. 2.

Process 300 includes determining a battery health (e.g., a state of health) of the battery (e.g., battery 64) using an equivalent series resistance technique (ESR) (step 312), according to some embodiments. Step 312 can be performed by ESR manager 222 using any of the techniques described in greater detail above with reference to FIG. 2 to categorize or estimate a state of health of battery 64.

Process 300 includes determining a battery fluid level and a percent of fluid remaining in the battery relative to a maximum level (step 314), according to some embodiments. Step 314 can include performing process 3300. Step 314 can be performed by battery fluid level manager 226 using any of the techniques described in greater detail above with reference to FIG. 2. For example, the battery fluid level can be determined or estimated based on a rate of Hydrogen gas evolution of battery 64 based on various conditions (e.g., temperature, charge, discharge, etc.) of battery 64.

Process 300 includes detecting one or more battery or charger alerts and providing the battery or charger alerts to a user (step 316), according to some embodiments. The battery or charger alerts can be detected based on the sensor data obtained in step 302 or based on CAN data obtained from CAN 210. The battery or charger alerts can also be detected based on any of the parameters determined in steps 302-314. Step 316 can be performed by alert manager 224 and GUI manager 228 and can include operating a user device 232 that is communicably coupled with controller 38 (e.g., wirelessly via Bluetooth) to display alert messages, icons, etc. Step 316 can include performing any of the functionality of alert manager 224 and/or GUI manager 228 as described in greater detail above.

Process 300 includes operating a user device to report the parameter $SoC_{BATT}$ (step 318), according to some embodiments. Step 318 can include providing the parameter $SoC_{BATT}$ in a GUI on user device 232 (e.g., via a mobile application). Step 318 may be performed by GUI manager 228 using any of the functionality as described in greater detail above.

Configuration of Exemplary Embodiments

The present disclosure contemplates methods, systems, and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

As utilized herein, the terms "approximately", "about", "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the terms "exemplary" and "example" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like, as used herein, mean the joining of two members directly or indirectly to one another. Such joining may be stationary (e.g., permanent, etc.) or moveable (e.g., removable, releasable, etc.). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," "between," etc.) are merely used to describe the orientation of various elements in the figures. It should be noted that the orientation of various elements may differ according to other exemplary embodiments, and that such variations are intended to be encompassed by the present disclosure.

Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

It is important to note that the construction and arrangement of the systems as shown in the exemplary embodiments is illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies of the components described herein may be constructed from any of a wide variety of materials that provide sufficient strength or durability, in any of a wide variety of colors, textures, and combinations. Accordingly, all such modifications are intended to be included within the scope of the present inventions. Other substitutions, modifications, changes, and omissions may be made in the design, operating conditions, and arrangement of the preferred and other exemplary embodiments without departing from scope of the present disclosure or from the spirit of the appended claim.

The invention claimed is:

1. A lift device comprising:
a plurality of electrical components; and
a battery monitoring system comprising:
a plurality of batteries configured to provide power to the plurality of electrical components; and
processing circuitry configured to:
determine an overall state of charge of the plurality of batteries based on a state of charge for open circuit conditions, a state of charge of the plurality of batteries for load conditions, and a state of charge for charging conditions, wherein in one or more conditions, the overall state of charge is a weighted average of at least two of the state of charge for open circuit conditions, the state of charge for load conditions, and the state of charge for charging conditions; and
operate a display screen to notify an operator regarding the overall state of charge of the plurality of batteries.

2. The lift device of claim 1, wherein weights of the weighted average are determined by the processing circuitry using a current of the power charging or discharging from the plurality of batteries.

3. The lift device of claim 1, wherein the state of charge of the plurality of batteries for open circuit conditions, the state of charge of the plurality of batteries for load conditions, and the state of charge of the plurality of batteries for charging conditions are determined by the processing circuitry based on sensor data obtained from the plurality of batteries.

4. The lift device of claim 1, wherein the processing circuitry is further configured to:
determine an amount of electrolyte present in the plurality of batteries based on a Hydrogen evolution rate of the plurality of batteries.

5. The lift device of claim 1, wherein the processing circuitry is wirelessly communicably coupled with a user device and is configured to generate a report for the user device, the report comprising the overall state of charge of the plurality of batteries, wherein the processing circuitry is configured to operate the user device to provide at least one of the overall state of charge of the plurality of batteries, the state of charge of the plurality of batteries for open circuit conditions, the state of charge of the plurality of batteries for load conditions, or the state of charge of the plurality of batteries for charging conditions.

6. The lift device of claim 1, wherein the processing circuitry is further configured to determine a battery health of one or more of the plurality of batteries based on a plurality of equivalent series resistance values each determined at different times and a battery temperature, wherein each of the plurality of equivalent series resistance values is determined based on:
a difference between (1) a voltage across the plurality of batteries before a battery function is performed and (2) a voltage across the plurality of batteries while the battery function is performed; and
a load current of the plurality of batteries that causes the difference.

7. The lift device of claim 1, wherein the processing circuitry is further configured to determine a battery fluid level and a percent of fluid remaining in the plurality of batteries relative to a maximum level.

8. A battery monitoring system for a lift device, the battery monitoring system comprising:
a plurality of batteries configured to power a plurality of electrical components of the lift device; and
processing circuitry configured to:
determine an overall state of charge of the plurality of batteries based on a state of charge for open circuit conditions, a state of charge of the plurality of batteries for load conditions, and a state of charge for charging conditions, wherein in one or more conditions, the overall state of charge is a weighted average of at least two of the state of charge for open circuit conditions, the state of charge for load conditions, and the state of charge for charging conditions; and
operate a display screen to notify an operator regarding the overall state of charge of the plurality of batteries.

9. The battery monitoring system of claim 8, wherein the processing circuitry is further configured to:
determine an amount of electrolyte present in the plurality of batteries based on a Hydrogen evolution rate of the plurality of batteries.

10. The battery monitoring system of claim 8, wherein the processing circuitry is wirelessly communicably coupled with a user device and is configured to generate a report for the user device, the report comprising the overall state of charge of the plurality of batteries.

11. The battery monitoring system of claim 10, wherein the processing circuitry is configured to operate the user device to provide at least one of the overall state of charge of the plurality of batteries, the state of charge of the plurality of batteries for open circuit conditions, the state of charge of the plurality of batteries for load conditions, or the state of charge of the plurality of batteries for charging conditions.

12. The battery monitoring system of claim 8, wherein the processing circuitry is further configured to determine a battery health of one or more of the plurality of batteries.

13. The battery monitoring system of claim 12, wherein the processing circuitry is configured to determine the battery health based on a plurality of equivalent series resistance values each determined at different times and a battery temperature, wherein each of the plurality of equivalent series resistance values is determined based on:
- a difference between (1) a voltage across the plurality of batteries before a battery function is performed and (2) a voltage across the plurality of batteries while the battery function is performed; and
- a load current of the plurality of batteries that causes the difference.

14. The battery monitoring system of claim 8, wherein the processing circuitry is further configured to determine a battery fluid level and a percent of fluid remaining in at least one of the plurality of batteries relative to a maximum level.

15. A method, comprising:
- determining an overall state of charge of a plurality of batteries based on a state of charge of the plurality of batteries for open circuit conditions, a state of charge of the plurality of batteries for load conditions based, and a state of charge of the plurality of batteries for charging conditions, wherein in one or more conditions, the overall state of charge is determined based on at least two of the state of charge of the plurality of batteries for open circuit conditions, the state of charge of the plurality of batteries for load conditions, or the state of charge of the plurality of batteries for charging conditions; and
- operating a display screen to provide the overall state of charge of the plurality of batteries to a user.

16. The method of claim 15, wherein determining the overall state of charge comprises determining a weighted average of at least two of the state of charge of the plurality of batteries for open circuit conditions, the state of charge of the plurality of batteries for load conditions, or the state of charge of the plurality of batteries for charging conditions.

17. The method of claim 15, further comprising:
- determining an amount of electrolyte present in the plurality of batteries based on a Hydrogen evolution rate of the plurality of batteries.

18. The method of claim 15, further comprising determining a battery health of one or more of the plurality of batteries.

19. The method of claim 18, wherein the battery health is determined based on a plurality of equivalent series resistance values of the plurality of batteries, wherein each of the plurality of equivalent series resistance values is determined based on:
- a difference between (1) a voltage across the plurality of batteries before a battery function is performed and (2) a voltage across the plurality of batteries while the battery function is performed; and
- a load current of the plurality of batteries that causes the difference.

20. The method of claim 18, further comprising:
- generating a report for a user device, the report comprising the overall state of charge of the plurality of batteries and the battery health of the plurality of batteries; and
- providing the report to the user device for display to the user.

* * * * *